United States Patent
Loy et al.

(10) Patent No.: US 11,335,852 B2
(45) Date of Patent: May 17, 2022

(54) RESISTIVE RANDOM ACCESS MEMORY DEVICES

(71) Applicant: GLOBALFOUNDRIES Singapore Pte. Ltd., Singapore (SG)

(72) Inventors: Desmond Jia Jun Loy, Singapore (SG); Eng Huat Toh, Singapore (SG); Shyue Seng Tan, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 24 days.

(21) Appl. No.: 17/026,303

(22) Filed: Sep. 21, 2020

(65) Prior Publication Data
US 2022/0093860 A1 Mar. 24, 2022

(51) Int. Cl.
*H01L 45/00* (2006.01)

(52) U.S. Cl.
CPC .......... *H01L 45/1273* (2013.01); *H01L 45/08* (2013.01); *H01L 45/1233* (2013.01); *H01L 45/16* (2013.01)

(58) Field of Classification Search
CPC .................................................. H01L 45/00
See application file for complete search history.

(56) References Cited

U.S. PATENT DOCUMENTS

2016/0359108 A1* 12/2016 Majhi ................... H01L 45/146

OTHER PUBLICATIONS

CH. Walczyk et al., On the role of Ti adlayers for resistive switching in HfO2-based metal-insulator-metal structures: Top versus bottom electrode integration, Journal of Vacuum Science & Technology B, 2011, p. 01AD02-1-01AD02-7, vol. 29—Issue 1, American Vacuum Society.
Pauline Calka et al., Engineering of the Chemical Reactivity of the Ti/HfO2 Interface for RRAM: Experiment and Theory, ACS Applied Materials & Interfaces, 2014, p. 5056-5060, vol. 6, American Chemical Society.
Xiaoliang Zhong et al., The effect of a Ta oxygen scavenger layer on HfO2-based resistive switching behavior: thermodynamic stability, electronic structure, and low-bias transport, Physical Chemistry Chemical Physics, 2016, p. 7502-7510, Issue 10, Royal Society of Chemistry.
Ying-Chen Chen et al., Characterization of SiOx/HfOx bilayer Resistive-Switching Memory Devices, ECS Transactions, 2016, p. 25-33, vol. 72—Issue 2, The Electrochemical Society.
L. Goux et al., Asymmetry and Switching Phenomenology in TiN\(Al2O3)\HfO2\Hf Systems, ECS Solid State Letters, 2012, p. 63-65, vol. 1—Issue 4, The Electrochemical Society.

* cited by examiner

*Primary Examiner* — Marvin Payen
(74) *Attorney, Agent, or Firm* — David Cain

(57) ABSTRACT

The present disclosure generally relates to memory devices and methods of forming the same. More particularly, the present disclosure relates to resistive random-access (Re-RAM) memory devices. The present disclosure provides a memory device including a dielectric layer having an opening, sidewalls along the opening, a first electrode in the opening, a resistive layer disposed upon the first electrode, an oxygen scavenging layer disposed upon the resistive layer, and a second electrode in contact with the oxygen scavenging layer. The oxygen scavenging layer includes a material that is different from the resistive layer and partially covers the resistive layer. The first electrode is electrically linked to the second electrode by the oxygen scavenging layer and the resistive layer.

20 Claims, 18 Drawing Sheets

RESISTIVE RANDOM ACCESS MEMORY DEVICES

FIELD OF THE INVENTION

The disclosed subject matter relates generally to memory devices and methods of forming the same. More particularly, the present disclosure relates to resistive random-access (ReRAM) memory devices.

BACKGROUND

Semiconductor devices and integrated circuit (IC) chips have found numerous applications in the fields of physics, chemistry, biology, computing, and memory devices. An example of a memory device is a non-volatile (NV) memory device. NV memory devices are programmable and have been extensively used in electronic products due to its ability to retain data for long periods, even after the power has been turned off. Exemplary categories for NV memory may include resistive random-access memory (ReRAM), erasable programmable read-only memory (EPROM), flash memory, ferroelectric random-access memory (FeRAM), and magnetoresistive random-access memory (MRAM).

Resistive memory devices can operate by changing (or switching) between two different states: a high resistance state (HRS), which may be representative of an off or '0' state; and a low resistance state (LRS), which may be representative of an on or '1' state. However, these devices may experience large variations in resistive switching characteristics and may cause large fluctuations of current flow within the device, which decreases the performance of the device and increases its power consumption.

Therefore, there is a need to provide improved memory devices that can overcome, or at least ameliorate, one or more of the disadvantages as described above.

SUMMARY

In an aspect of the present disclosure, there is provided a memory device including a dielectric layer having an opening, a first electrode in the opening, a resistive layer disposed upon the first electrode, a first oxygen scavenging layer disposed upon the resistive layer, and a second electrode in contact with the first oxygen scavenging layer. The first oxygen scavenging layer includes a material that is different from the resistive layer and partially covers the resistive layer.

In another aspect of the present disclosure, there is provided a memory device including a dielectric layer having an opening, sidewalls along the opening, a first electrode in the opening, a resistive layer disposed upon the first electrode and along the sidewalls, a first oxygen scavenging layer disposed upon the resistive layer, and a second electrode in contact with the first oxygen scavenging layer and the resistive layer. The first oxygen scavenging layer includes a material that is different from the resistive layer and partially covers the resistive layer.

In yet another aspect of the present disclosure, there is provided a method of forming a memory device by forming an opening in a dielectric layer, forming a first electrode in the opening, forming a resistive layer upon the first electrode, forming an oxygen scavenging layer upon the resistive layer, in which the oxygen scavenging layer includes a material that is different from the resistive layer and partially covers the resistive layer, and forming a second electrode upon the oxygen scavenging layer.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1A:
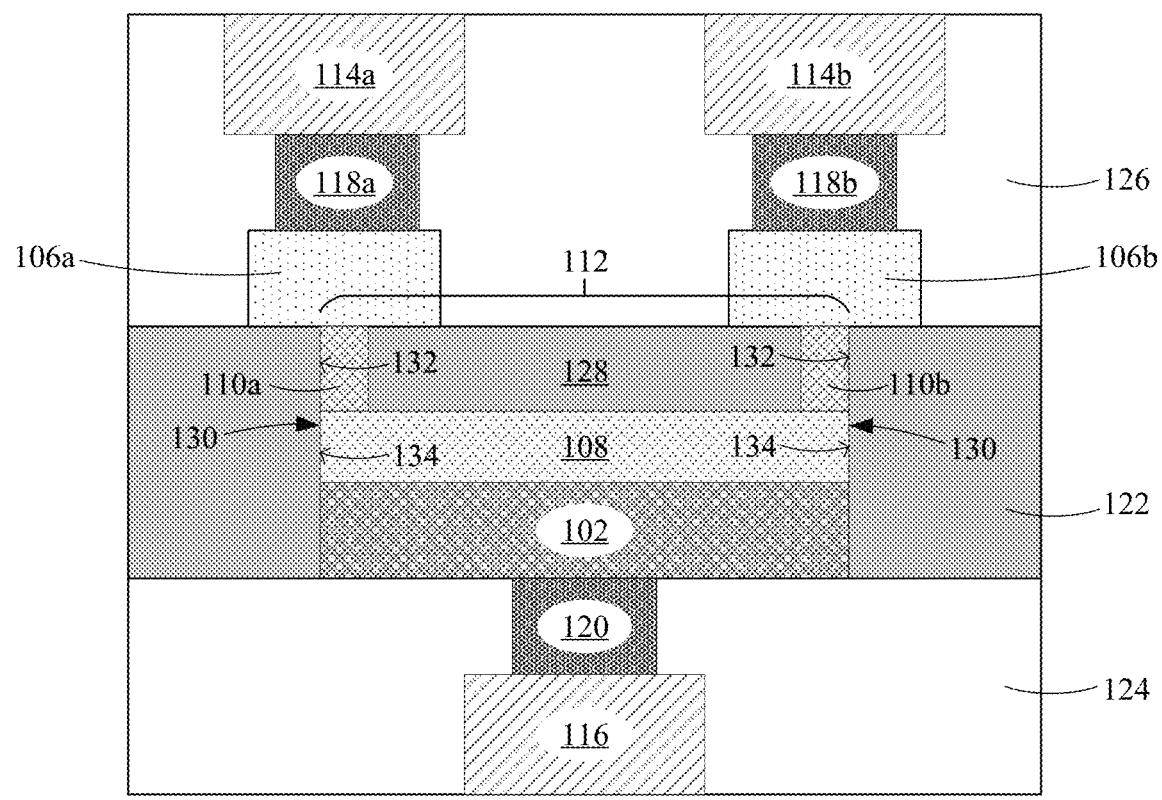
FIG. 1A is a cross sectional view of an embodiment of a memory device, in accordance with the present disclosure.

FIG. 1A illustrates a cross-sectional view of an exemplary memory device in accordance with the present disclosure. The device includes a dielectric layer 122 having an opening 112 and sidewalls 130 along the opening 112. A first electrode 102 is disposed in the opening 112 and a resistive layer 108 is disposed upon the first electrode 102. At least one oxygen scavenging layer may be disposed upon the resistive layer 108. For example, in FIG. 1A, the device may include a first oxygen scavenging layer 110a and a second oxygen scavenging layer 110b, both of which are disposed upon the resistive layer 108. As used herein, the terms "oxygen scavenging" or "oxygen scavenger" may refer to a composition, layer, film, or material that can consume, deplete, or react with oxygen ions from a given environment. In some embodiments, the first oxygen scavenging layer 110a and the second oxygen scavenging layer 110b may have substantially identical widths, and may include the same material. In other embodiments, the first oxygen scavenging layer 110a and the second oxygen scavenging layer 110b may have dissimilar widths. The first oxygen scavenging layer 110a may also include a material that is different from the second oxygen scavenging layer 110b.

A second electrode 106a may be disposed upon the first oxygen scavenging layer 110a and a third electrode 106b may be disposed upon the second oxygen scavenging layer 110b. The second electrode 106a contacts the first oxygen scavenging layer 110a and is electrically linked to the first electrode 102 by the first oxygen scavenging layer 110a and the resistive layer 108. The third electrode 106b contacts the second oxygen scavenging layer 110b and is electrically linked to the first electrode 102 by the second oxygen scavenging layer 110b and the resistive layer 108.

The resistive layer 108 is partially covered by the first oxygen scavenging layer 110a and the second oxygen scavenging layer 110b. The first oxygen scavenging layer 110a may be spaced apart from the second oxygen scavenging layer 110b. In an embodiment, both of the first oxygen scavenging layer 110a and the second oxygen scavenging layer 110b may have smaller widths than the resistive layer 108. Additionally, the sum of the widths of the oxygen scavenging layers 110a, 110b may be smaller than the width of the resistive layer 108.

A dielectric cap 128 may be disposed upon the resistive layer and spaces apart the first oxygen scavenging layer 110a from the second oxygen scavenging layer 110b. The dielectric cap 128 may have an upper surface that is substantially coplanar with the upper surfaces of the dielectric layer, the first oxygen scavenging layer 110a, and the second oxygen scavenging layer 110b. The dielectric cap 128 may include the same material as the dielectric layer 122.

The first oxygen scavenging layer 110a and the second oxygen scavenging layer 110b may each have an upper surface that is substantially coplanar with an upper surface of the dielectric layer 122. In some embodiments, the first oxygen scavenging layer 110a and the second oxygen scavenging layer 110b may have side facets 132 that abut the sidewalls 130 of the opening 112. The side facets 132 of the first oxygen scavenging layer 110a and the second oxygen scavenging layer 110b may also be substantially aligned with side edges 134 of the resistive layer 108.

The first electrode 102, the second electrode 106a, and the third electrode 106b may be connected to various interconnect structures 114a, 114b, 116, 118a, 18b, 120 to send or receive electrical signals between other circuitry and/or active components in a memory device. The interconnect structures may include interconnect vias 118a, 118b, 120 and conductive lines 114a, 114b, 116, and may include a metal such as copper, cobalt, aluminum, or an alloy thereof. The conductive lines 114a, 114b, 116 may be configured as source lines, bit lines, or word lines, depending on the design requirements of the memory device. As used herein, the terms "source line(s)", "word line(s)", and "bit line(s)" may refer to electrical terminal connections that link cells in a memory device circuitry.

For example, in the embodiment shown in FIG. 1A, a first bit line (e.g., conductive line 114a) may be arranged above and connected to the second electrode 106a by interconnect via 118a. A second bit line (e.g., conductive line 114b) may be arranged above and connected to the third electrode 106b by interconnect via 118b. A source line (e.g., conductive line 116) may be arranged below and connected to the first electrode 102 by interconnect via 120.

Examples of the active components (not shown) that may be connected to the first electrode 102, the second electrode 106a, and the third electrode 106b may include diodes (e.g., a bi-directional diode, a single-photon avalanche diode, etc.) or transistors such as, but not limited to, planar field-effect transistor, fin-shaped field-effect transistors (FinFETs), ferroelectric field-effect transistors (FeFETs), complementary metal-oxide semiconductor (CMOS) transistors, and bi-polar junction transistors (BJT).

Conductive paths may be configured to form in the resistive layer 108, the first oxygen scavenging layer 110a, and the second oxygen scavenging layer 110b in response to electric signals (e.g., a set voltage or current). In particular, the conductive paths may electrically link the first electrode 102 to the second electrode 106a, and the first electrode 102 to the third electrode 106b, depending on the operation of the device.

In the embodiment shown in FIG. 1A, the first electrode 102 may be structured as an inert electrode while the second electrode 106a and the third electrode 106b may be structured as active electrodes. As used herein, the term "active electrode" may refer to an electrode having a conductive material that is capable of being oxidized and/or reduced (i.e., redox reactions) to generate electric charges for the formation of the conductive paths. Examples of the conductive material in the active electrode may include, but not limited to, tantalum (Ta), hafnium (Hf), titanium (Ti), copper (Cu), silver (Ag), cobalt (Co), tungsten (W), or an alloy thereof. Conversely, the term "inert electrode" may refer to a conductive material that is capable of resisting redox reactions. Examples of the conductive material for the inert electrode may include, but not limited to, ruthenium (Ru), platinum (Pt), titanium nitride (TiN), tantalum nitride (TaN). Preferably, the active electrode may be structured to have a larger thickness as compared to the inert electrode. A larger thickness for the active electrode may provide sufficient material for the redox reaction between the active electrode and the resistive layer.

For example, a set voltage may be applied to the conductive line 114a to provide a potential difference between the first electrode 102 and the second electrode 106a. This potential difference may cause the formation of the conductive path (not shown) in the first oxygen scavenging layer 110a and the resistive layer 108 to allow electrical conduction between the first electrode 102 and the second electrode 106a. In particular, the conductive path may be a filament that is formed by diffusion or drift of electrical charges (e.g., ions, electrons) induced by the potential difference.

The resistive layer 108 may also be configured to have a switchable resistance in response to a change in the electric signal. The formation of the filament in the resistive layer 108 may reduce the resistance of the resistive layer 108 when the electric signal is applied. Upon a reversed flow of the electric signal, the filament may be removed and the resistance of the resistive layer 108 may be increased, thereby enabling a controllable resistive nature of the resistive layer 108. The resistive layer 108 may exhibit resistive changing properties characterized by different resistance states of the material forming this layer. These resistance states (e.g., a high resistance state (HRS) or a low resistance state (LRS)) may be used to represent one or more bits of information.

The first oxygen scavenging layer 110a and the second oxygen scavenging layer 110b may be configured to induce a movement of ions from the resistive layer 108 towards the active electrodes in response to the electric signal. For example, the first oxygen scavenging layer 110a may scavenge oxygen ions from the resistive layer 108 to increase the concentration or density of oxygen vacancies in the resistive layer 108 when a potential difference is applied across the active electrode (e.g., the second electrode 106a) and the inert electrode (e.g., the first electrode 102). The oxygen ions scavenged by the first oxygen scavenging layer 110a may subsequently drift to the active electrode to complete the conductive path between the first electrode 102 and the second electrode 106a.

During operational switching used to change the stored data, the resistive layer 108 may change its resistance state when a switching electric signal (e.g., a set voltage or a reset voltage) is applied to the resistive layer 108 and the oxygen scavenging layers 110a, 110b. The inclusion of the oxygen scavenging layers 110a, 110b between the resistive layer 108 and the second and third electrodes 106a, 106b may lower the resistance for the conductive path to connect the first electrode 102 with the second electrode 106a and the third electrode 106b.

Advantageously, by partially covering the resistive layer 108 with the oxygen scavenging layers 110a, 110b, the area of contact between the resistive layer 108 and the oxygen scavenging layers 110a, 110b can be reduced. For example, the respective widths of the first oxygen scavenging layer 110a and the second oxygen scavenging layer 110b may be smaller than the width of the resistive layer 108, which achieves a reduced area of contact. Using the reduced area of contact and the smaller widths of the oxygen scavenging layers 110a, 110b, the conductive paths formed between the active electrode and the inert electrode can be confined, and do not form randomly along the length of the resistive layer 108. The confinement of the conducting path may help to reduce the stochasticity of its formation, which in turn reduces the cycle-to-cycle and device-to-device variability of the memory devices in the high resistive state. In other words, the variability of the resistance of the resistive layer 108 in the high resistive state may be reduced. This may enable a stable switching of the resistive states in the resistive layer 108 during operation of the device and may reduce its overall power consumption.

More advantageously, by configuring the side facets 132 of the oxygen scavenging layers 110a, 110b to abut the sidewalls 130 of the opening 112 in the dielectric layer 122, the side facets 132 of the oxygen scavenging layers 110a, 110b may be aligned with the side edges 134 of the resistive layer 108.

Advantageously, the dielectric cap 128 may prevent the formation of any conductive paths (or filaments) in portions of the resistive layer 108 that is uncovered by the oxygen scavenging layers 110a, 110b. Hence, the filaments may be confined within the oxygen scavenging layers 110a, 110b, thereby reducing the variability of the resistance of the resistive layer 108.

The resistive layer 108 may have a thickness that is configured so that a relatively low voltage level may be sufficient to switch the resistance of the resistive layer 108. In some embodiments, the resistive layer 108 may have a thickness in the range of about 1 nm to about 10 nm. Examples of the material for the resistive layer 108 may include, but are not limited to, carbon polymers, perovskites, silicon dioxide, metal oxides, or nitrides. Some examples of metal oxides may include lanthanide oxides, tungsten oxide, zinc oxide, nickel oxide, niobium oxide, titanium oxide, hafnium oxide, aluminum oxide, tantalum oxide, zirconium oxide, yttrium oxide, scandium oxide, magnesium oxide, chromium oxide, and vanadium oxide. Examples of nitrides may include boron nitride and aluminum nitride. In some embodiments, metal oxides with a bandgap greater than 3 eV may be used. Examples of such oxides may include titanium oxide, tungsten oxide, niobium oxide, nickel oxide, zinc oxide, lanthanide oxides, hafnium oxide, aluminum oxide, tantalum oxide, zirconium oxide, and yttrium oxide.

The oxygen scavenging layers 110a, 110b may include a material that is different from the resistive layer 108. In some embodiments, the oxygen scavenging layers 110a, 110b may include a metal such as tantalum (Ta), titanium (Ti), tungsten (W), hafnium oxide ($HfO_2$), or an oxide such as aluminum oxide ($Al_2O_3$).

In the embodiment shown in FIG. 1A, the conductive line 116 and the interconnect via 120 may be formed in a first dielectric region 124. The dielectric layer 122 may be disposed upon the first dielectric region 124. Examples of dielectric material in the dielectric layer 122 may include, but not limited to, silicon dioxide ($SiO_2$), silicon nitride ($Si_3N_4$), nitrogen doped silicon carbide (SiCN), $SiC_xH_z$ (i.e., BLoK™), or $SiN_wC_xH_z$ (i.e., NBLoK™), wherein each of w, x, y, and z independently has a value greater than 0 and less than 0.75.

A second dielectric region 126 may be disposed upon the dielectric layer 122. The second dielectric region 126 may include the second electrode 106a, the third electrode 106b, the interconnect vias 118a, 118b, and the conductive lines 114a, 114b. The first dielectric region 124 and the second dielectric region 126 may be an inter-metal dielectric (IMD) layer or part of a "metallization level". Examples of dielectric material in the first dielectric region 124 and the second dielectric region 126 may include, but are not limited to, silicon dioxide, tetraethyl orthosilicate (TEOS), or a material having a chemical composition of $SiC_xO_yH_z$, wherein x, y, and z are in stoichiometric ratio.

Figure 1B:
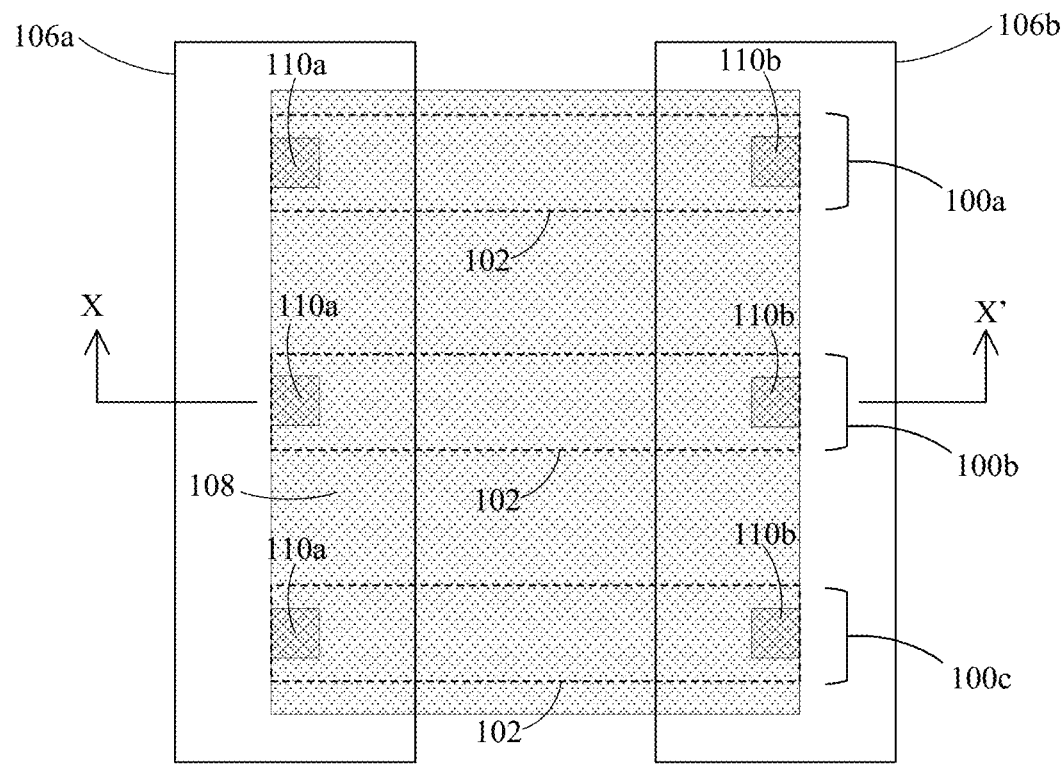
FIG. 1B and FIG. 1C are top-down views of the memory device shown in FIG. 1A, in accordance with the present disclosure.
Figure 1C:
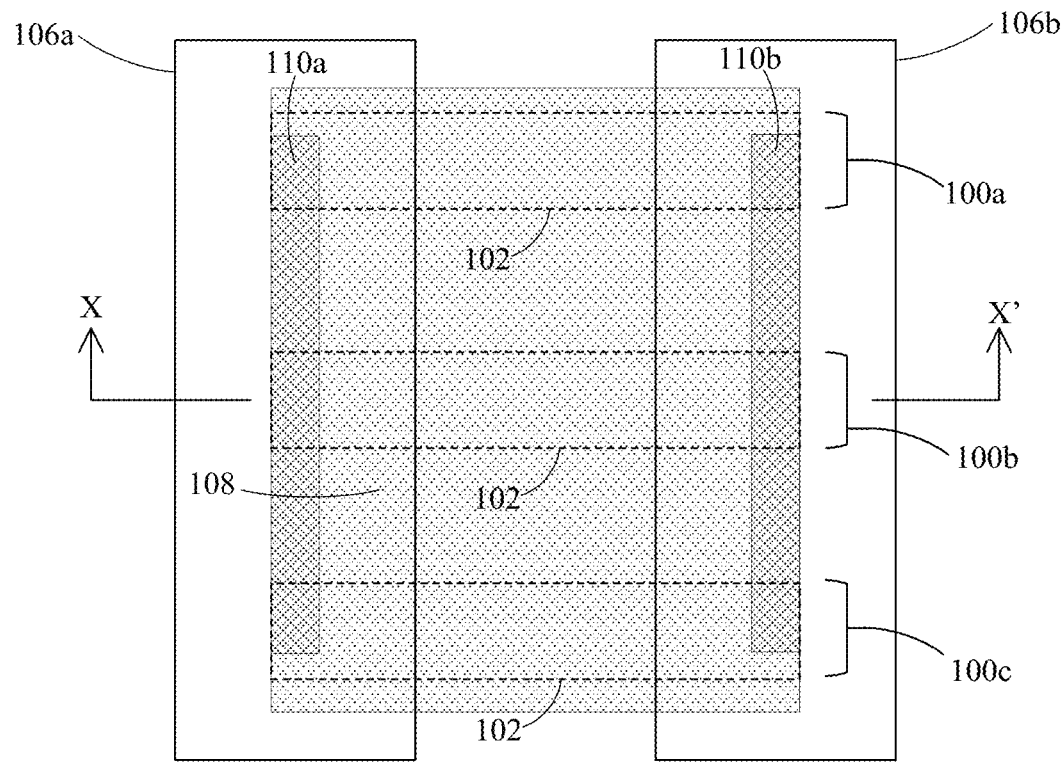

FIG. 1B and FIG. 1C illustrate various examples of configuring the oxygen scavenging layers 110a, 110b upon the resistive layer 108. Section line X-X' indicates the cross-section from which the view in FIG. 1A is taken from. For simplicity, only the first electrode 102, the second electrode 106a, the third electrode 106b, the resistive layer 108, the oxygen scavenging layer 110a, 110b, and the third electrode 107 are shown. The first electrode 102 is represented by a rectangle with a broken outline. The second electrode 106a and the third electrode 106b are represented by a rectangle with a solid outline.

As shown in FIG. 1B, the device may include an array of memory cells 100a, 100b, 100c. Each memory cell 100a, 100b, 100c may be configured to include the first oxygen scavenging layer 110a, the second oxygen scavenging layer 110b, and the first electrode 102. The resistive layer 108, the second electrode 106a, and the third electrode 106b may be structured to extend across each memory cell 100a, 100b, 100c.

The embodiment in FIG. 1C is similar to the embodiment in FIG. 1B, except that in FIG. 1C, the first oxygen scavenging layer 110a and the second oxygen scavenging layer 110b may be structured to extend across each memory cell 100a, 100b, 100c. In this embodiment, the oxygen scavenging layer 110a, 110b may include an oxide as described herein.

Figure 2:
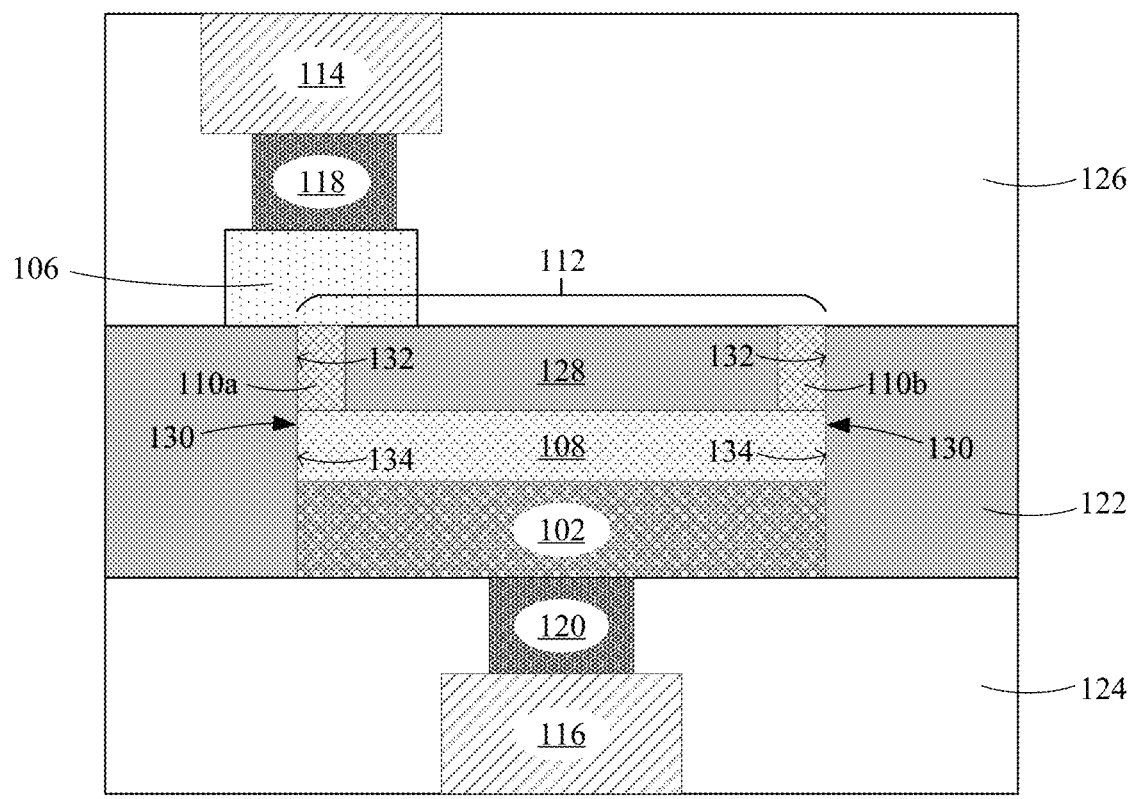
FIG. 2 through FIG. 6 are cross-sectional views of other embodiments of a memory device, in accordance with the present disclosure.

Referring to FIG. 2, in which like reference numerals refer to like features in FIG. 1A, another embodiment of a memory device is shown. The embodiment shown in FIG. 2 is similar to the embodiment shown in FIG. 1 except that in FIG. 2, the third electrode and its associated interconnections are absent. As shown in FIG. 2, the second electrode 106 is disposed upon the first oxygen scavenging layer 110a while the second oxygen scavenging layer 110b is not in contact with an electrode. Accordingly, the conductive path may be confined within the first oxygen scavenging layer 110a to link the first electrode 102 to the second electrode 106. A bit line (e.g., conductive line 114) may be arranged above and connected to the second electrode 106. A source line (e.g., conductive line 116) may be arranged below and connected to the first electrode 102.

Figure 3:
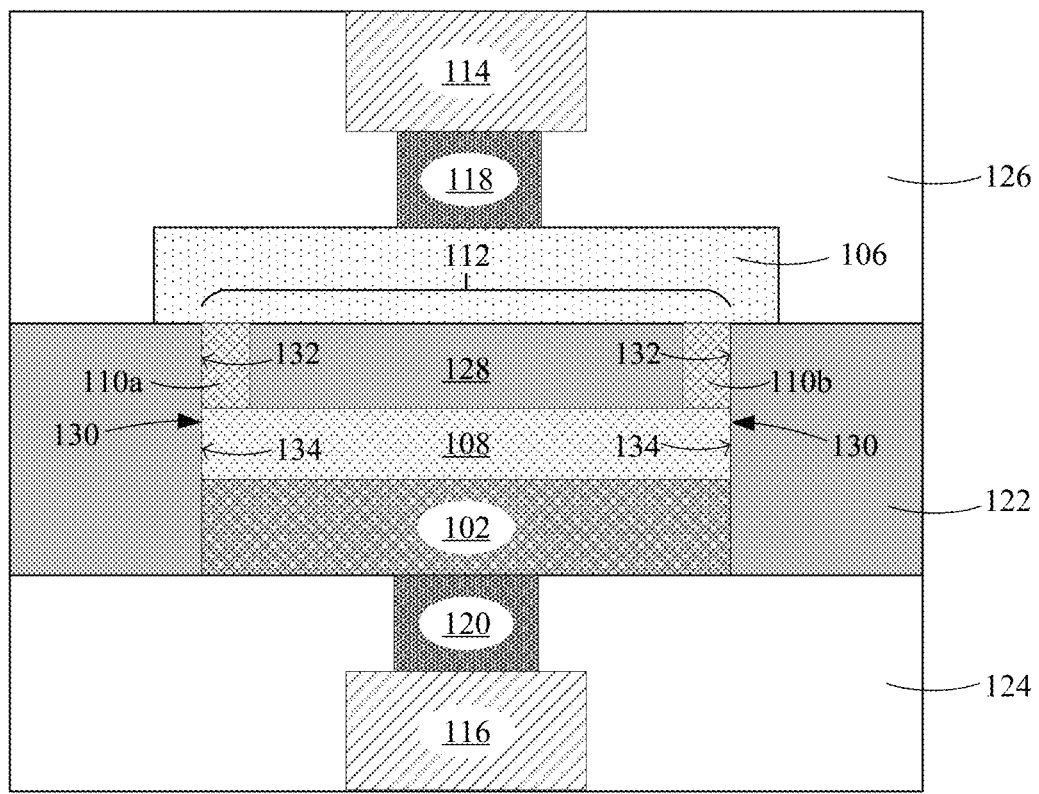

Referring to FIG. 3, in which like reference numerals refer to like features in FIG. 2, another embodiment of a memory device is shown. The embodiment shown in FIG. 3 is similar to the embodiment shown in FIG. 2 except that in FIG. 3, the second electrode 106 extends laterally to contact the second oxygen scavenging layer 110b. Accordingly, conductive paths may be confined within both the first oxygen scavenging layer 110a and the second oxygen scavenging layer 110b to link the first electrode 102 to the second electrode 106.

Figure 4:
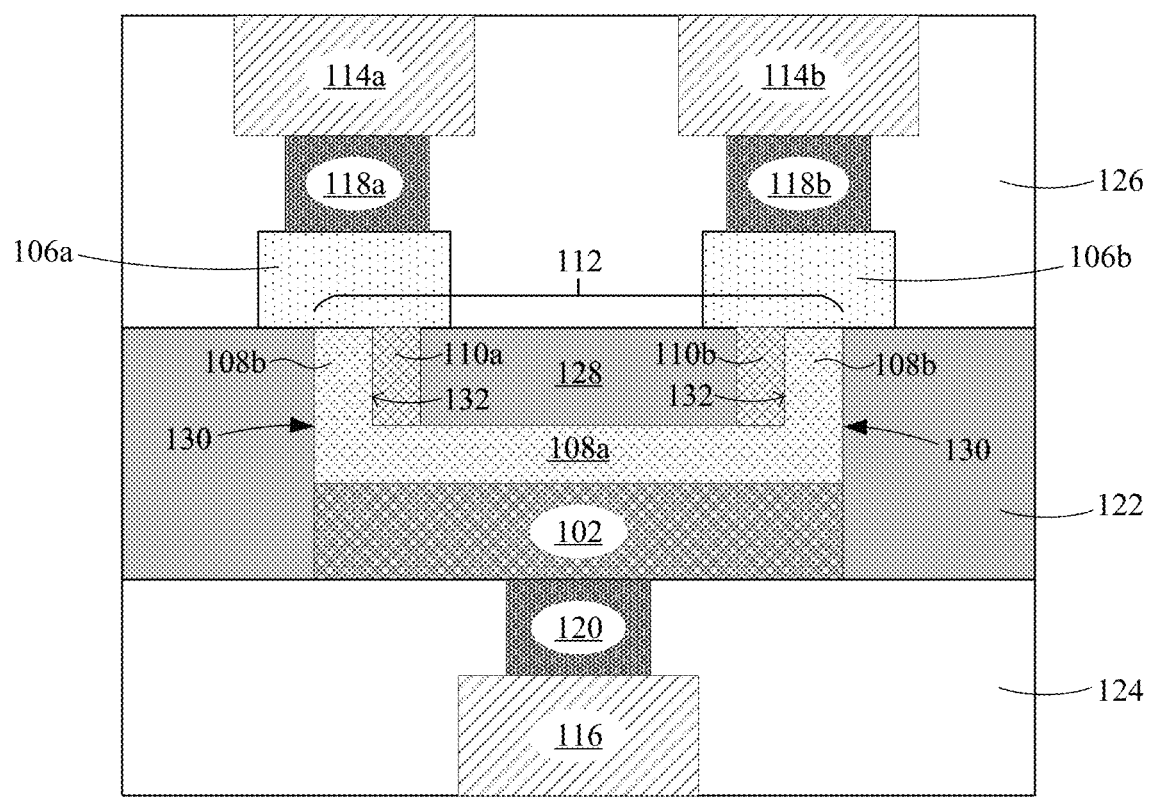

Referring to FIG. 4, in which like reference numerals refer to like features in FIG. 1A, another embodiment of a memory device is shown. As shown in FIG. 4, the resistive layer 108 may be modified to be disposed upon the first electrode 102 and along the sidewalls 130 of the opening 112 in the dielectric layer 122. For example, the resistive layer 108 may have a first segment 108a disposed upon the first electrode 102 and a second segment 10ba disposed along the sidewalls 130 of opening 112.

The oxygen scavenging layers 110a, 110b may partially cover the resistive layer 108. For example, the oxygen scavenging layers 110a, 110b may be disposed upon the first segment 108a of the resistive layer 108. The side facets 132 of the oxygen scavenging layers 110a, 110b may abut the second segment 108b of the resistive layer 108. The dielectric cap 128 may be disposed upon the first segment 108a of the resistive layer 108 and electrically isolates the first oxygen scavenging layer 110a from the second oxygen scavenging layer 110b. The second segment 108b of the resistive layer 108 may have an upper surface that is substantially coplanar with the upper surfaces of the dielectric layer 122, the dielectric cap 128, and the oxygen scavenging layers 110a, 110b.

The second electrode 106a may be disposed upon the first oxygen scavenging layer 110a and the second segment 108b of the resistive layer 108. The third electrode 106b may be disposed upon the second oxygen scavenging layer 110b and the second segment 108b of the resistive layer 108. The second electrode 106a is electrically linked to the first electrode 102 by having the second electrode 106a contact the first oxygen scavenging layer 110a and the resistive layer 108. The third electrode 106b is electrically linked to the first electrode 102 by having the third electrode 106b contact the second oxygen scavenging layer 110b and the resistive layer 108.

In the embodiment shown in FIG. 4, the second electrode 106a and the third electrode 106b may be structured as active electrodes while the first electrode 102 may be structured as an inert electrode. Due to the lower resistance in the oxygen scavenging layers 110a, 110b, conductive paths may be formed in the first segment 108a of the resistive layer 108 and traverse through the oxygen scavenging layers 110a, 110b to link the active electrodes to the inert electrode. In other words, the conductive paths may not form at regions of the first segment 108a of the resistive layer 108 that is uncovered by the oxygen scavenging layers 110a, 110b.

Figure 5:
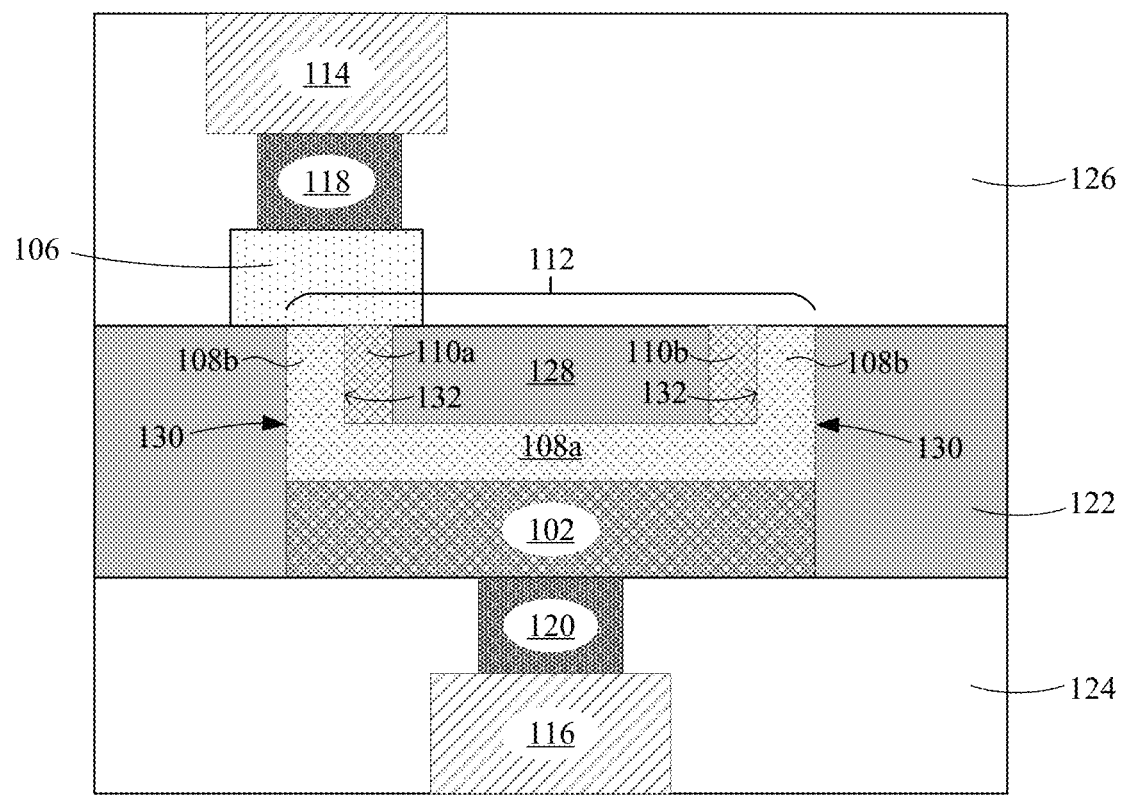

Referring to FIG. 5, in which like reference numerals refer to like features in FIG. 4, another embodiment of a memory device is shown. The embodiment shown in FIG. 5 is similar to the embodiment shown in FIG. 4 except that in FIG. 5, the third electrode and its associated interconnections are absent. As shown in FIG. 5, the second electrode 106 is disposed upon the first oxygen scavenging layer 110a and the second segment 108b of the resistive layer 108 while the second oxygen scavenging layer 110b is not in contact with an electrode.

Figure 6:
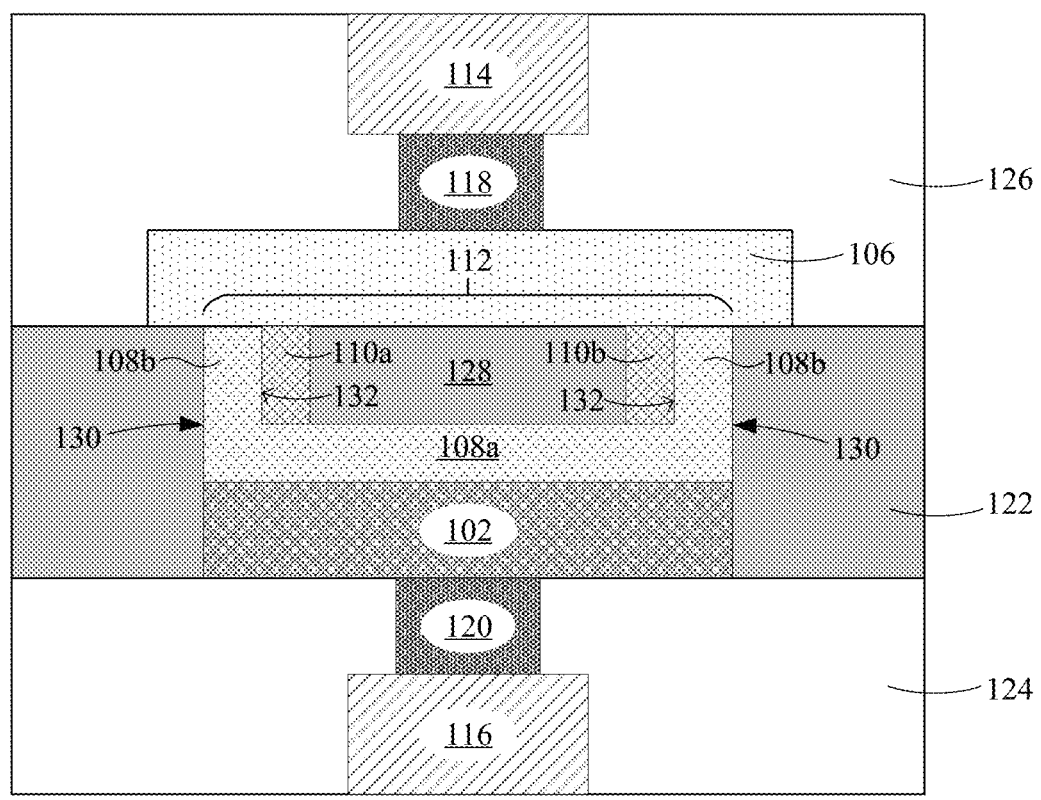

Referring to FIG. 6, in which like reference numerals refer to like features in FIG. 5, another embodiment of a memory device is shown. The embodiment shown in FIG. 6 is similar to the embodiment shown in FIG. 5 except that in FIG. 6, the second electrode 106 extends laterally to contact the second oxygen scavenging layer 110b.

The memory device described herein may be a resistive memory device. Examples of the resistive memory device may include, but are not limited to, oxide random-access memory (OxRAM). The embodiments shown in FIG. 1A and FIG. 4 may be referred to as a "1-transistor-2-resistor (1T2R)" configuration, while the embodiments shown in FIG. 2, FIG. 3, FIG. 5, and FIG. 6 may be referred to as a "1-transistor-1-resistor (1T1R)" configuration.

FIGS. 7 through 12 show a set of steps that may be used to create the memory devices as provided for in embodiments of the present disclosure.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" includes deposition of material or photoresist, patterning, exposure, development, etching, cleaning, and/or removal of the material or photoresist as required in forming a described pattern, structure, or opening. Examples of techniques for patterning include, but not limited to, wet etch lithographic processes, dry etch lithographic processes, or direct patterning processes. Such techniques may use mask sets and mask layers.

Figure 7:
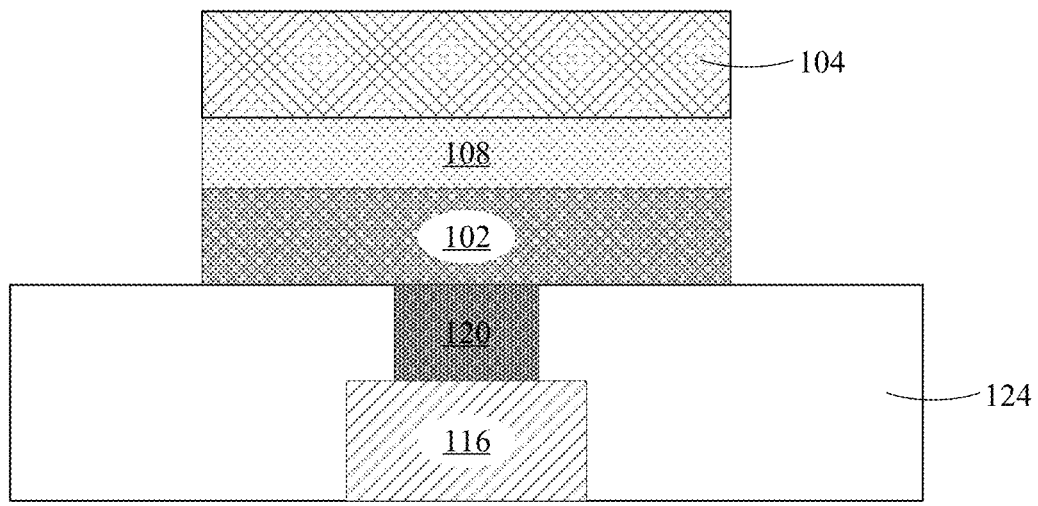
FIG. 7 through FIG. 12 are cross-sectional views depicting an exemplary set of steps for fabricating a memory device, in accordance with embodiments of the present disclosure.
Figure 8:
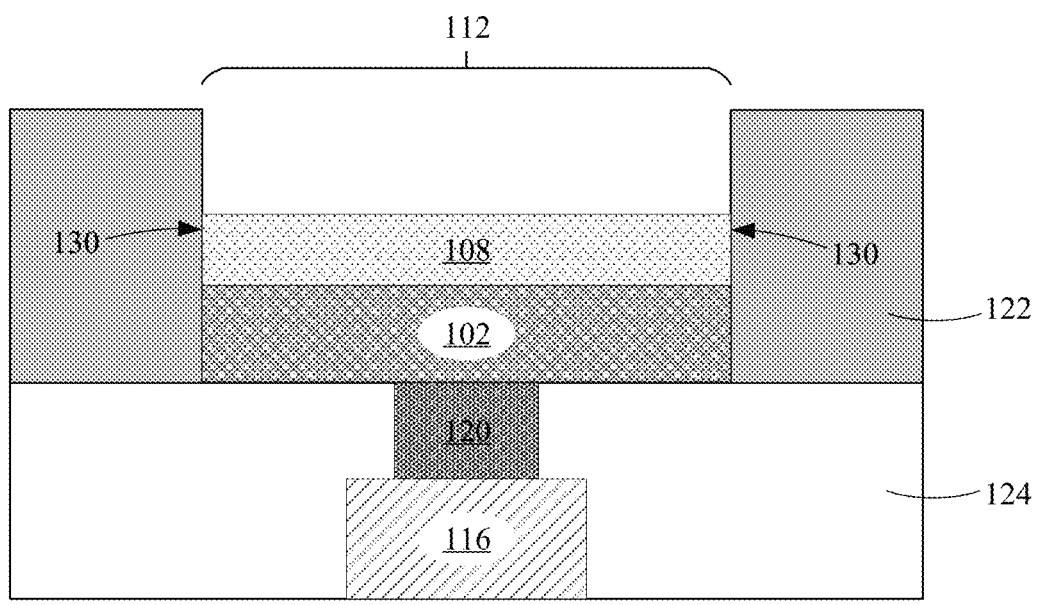

FIG. 7 and FIG. 8 illustrate the formation of a first electrode 102 and a resistive layer 108 in an opening 112 defined in the dielectric layer 122. Referring to FIG. 7, a device structure for use in fabricating the memory devices of the present disclosure is shown. The device structure may include a first dielectric region 124 having a conductive line 116 and an interconnect via 120. A first electrode 102 may be formed on the first dielectric region 124 and contacting the interconnect via 120. A resistive layer 108 may be formed on the first electrode 102. In an embodiment, the first electrode 102 and the resistive layer 108 may be formed by depositing layers of material using the deposition techniques described herein, followed by patterning the deposited layers using the patterning techniques described herein. A mask element 104 may be used during the patterning step to form the first electrode 102 and the resistive layer 108.

Referring to FIG. 8, a dielectric layer 122 may be formed upon the first dielectric region 124 using the deposition techniques described herein. The deposited dielectric layer 122 may laterally surround the first electrode 102, the resistive layer 108, and the mask element 104 such that the first electrode 102, the resistive layer 108, and the mask element 104 are in an opening 112 defined in the dielectric layer 122. A chemical mechanical planarization (CMP) process may be performed on the upper surfaces of the mask element 104 and the dielectric layer 122. The mask element 104 may be subsequently removed using an etch process or a stripping process to expose the resistive layer 108.

In an alternative embodiment (not shown) to form the first electrode 102 and the resistive layer 108 in the opening 112, the mask element 104 may be formed upon the dielectric layer 122, followed by etching portions of the dielectric layer 122 uncovered by the mask element 104 (using patterning techniques described herein) to define the opening 112 in the dielectric layer 122. Thereafter, materials to form the first electrode 102 and the resistive layer 108 may be deposited in the opening 112 and upon the mask element 104. The mask element 104 and the materials deposited thereupon may be subsequently removed using etching or stripping processes to arrive at the structure shown in FIG. 8.

Figure 9:
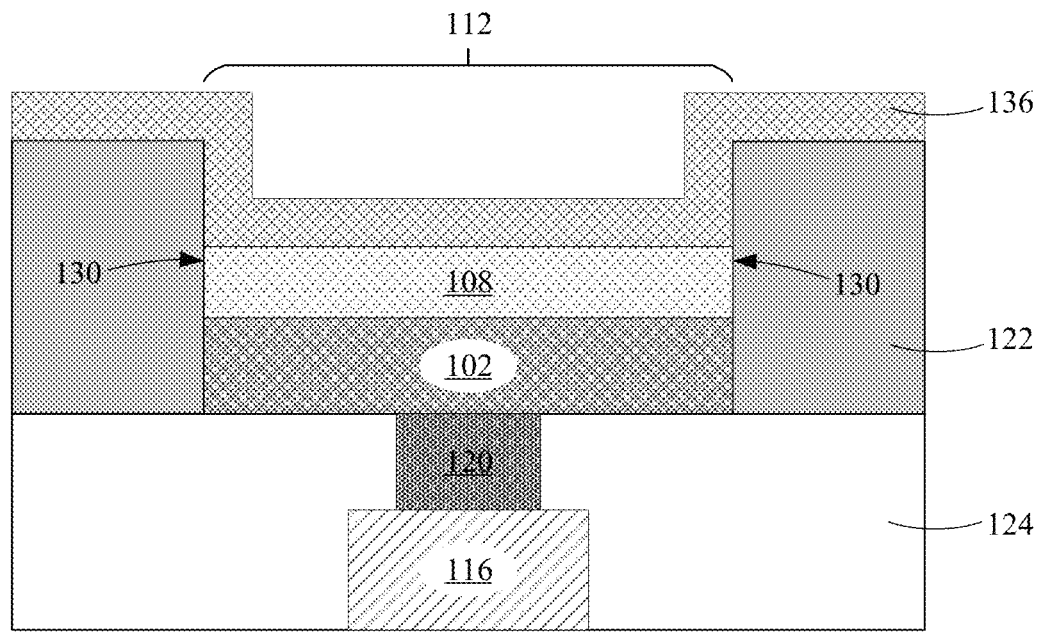
Figure 10:
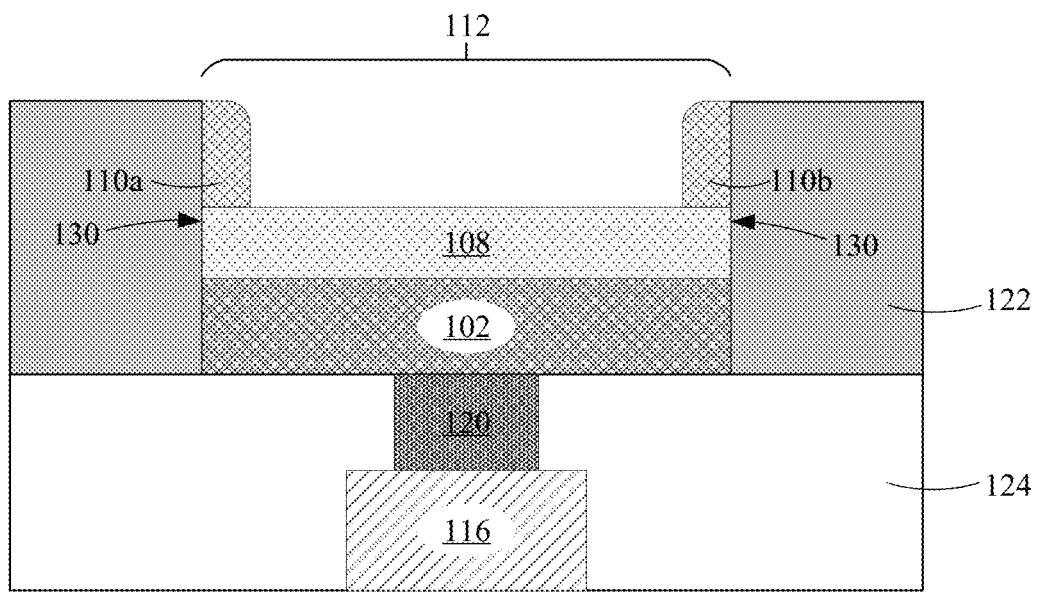

FIG. 9 and FIG. 10 illustrate the formation of oxygen scavenging layers 110a, 110b upon the resistive layer 108. As shown in FIG. 9, an oxygen scavenging material layer 136 may be deposited upon the dielectric layer 122 and within the opening 112, using the deposition techniques described herein. Preferably, a conformal deposition process such as an ALD process or a highly-conformal CVD process may be used.

Referring to FIG. 10, the deposited layer 136 may be patterned using patterning techniques described herein to form the first oxygen scavenging layer 110a and the second oxygen scavenging layer 110b. As shown, the oxygen scavenging layers 110a, 110b partially covers the resistive layer 108 after the patterning step. In this embodiment, the first oxygen scavenging layer 110a and the second oxygen scavenging layer 110b may have substantially identical widths and include the same material.

Figure 11:
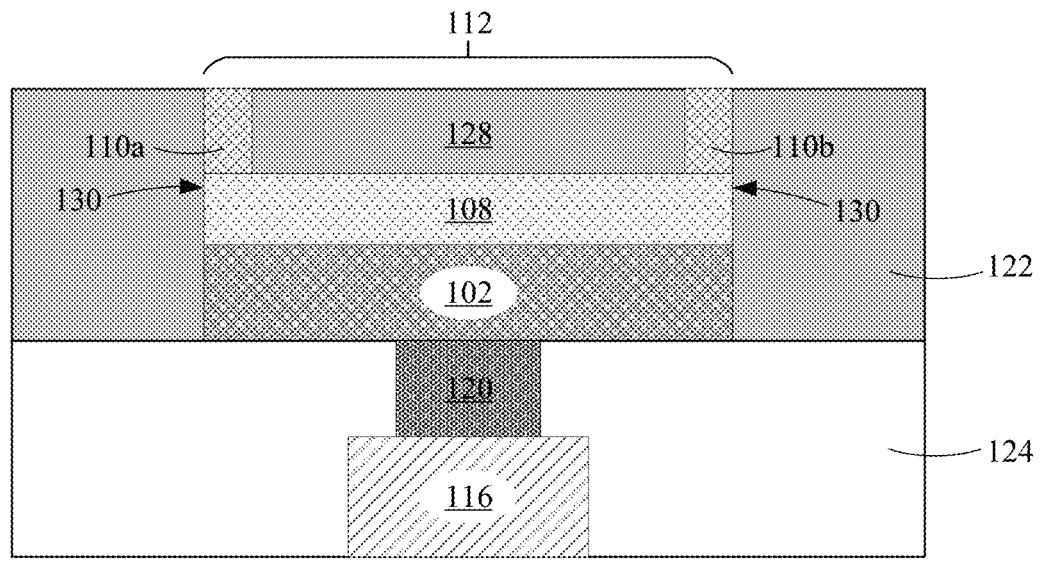

Referring to FIG. 11, a dielectric cap 128 may be deposited upon the portion of the resistive layer 108 that is uncovered by the oxygen scavenging layers 110a, 110b. A CMP process may be performed to ensure that the upper surfaces of the dielectric layer 122, the oxygen scavenging layer 110a, 110b, and the dielectric cap 128 are substantially coplanar with each other.

Figure 12:
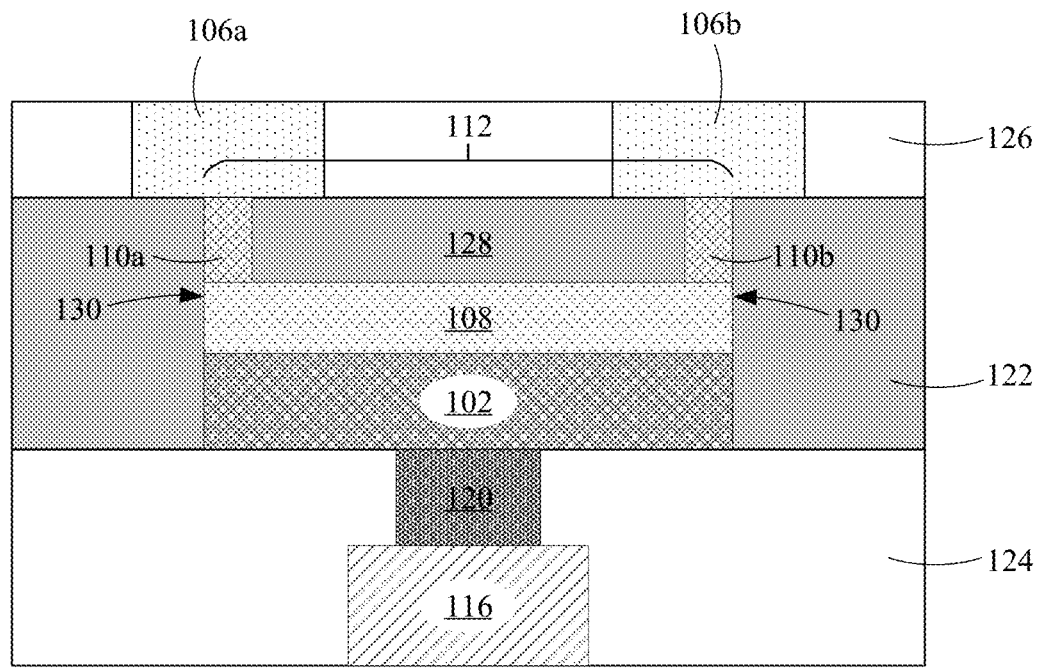

FIG. 12 illustrates the formation of electrodes to contact the oxygen scavenging layers 110a, 110b. As shown in FIG. 12, a second electrode 106a may be formed upon the first oxygen scavenging layer 110a, and a third electrode 106b may be formed upon the second oxygen scavenging layer 110b. For example, a second dielectric region 126 may be formed upon the dielectric layer 122 by depositing dielectric materials using the deposition techniques described herein. The second dielectric region 126 may be subsequently patterned to define electrode openings (not shown) using the patterning techniques described herein.

The second electrode 106a and the third electrode 106b may be formed in the electrode openings by depositing conductive materials using the deposition techniques described herein. Further processing steps may be performed, such as the formation of interconnect structures in the second dielectric region 126 to provide electrical connections with the second electrode 106a and the third electrode 106b. In other embodiments, the patterning of the second dielectric region 126 may be modified to form a single electrode opening above the oxygen scavenging layers 110a, 110b for subsequent deposition of a metal therein.

FIGS. 13 through 18 show another set of steps that may be used to create the memory devices as provided for in embodiments of the present disclosure.

Figure 13:
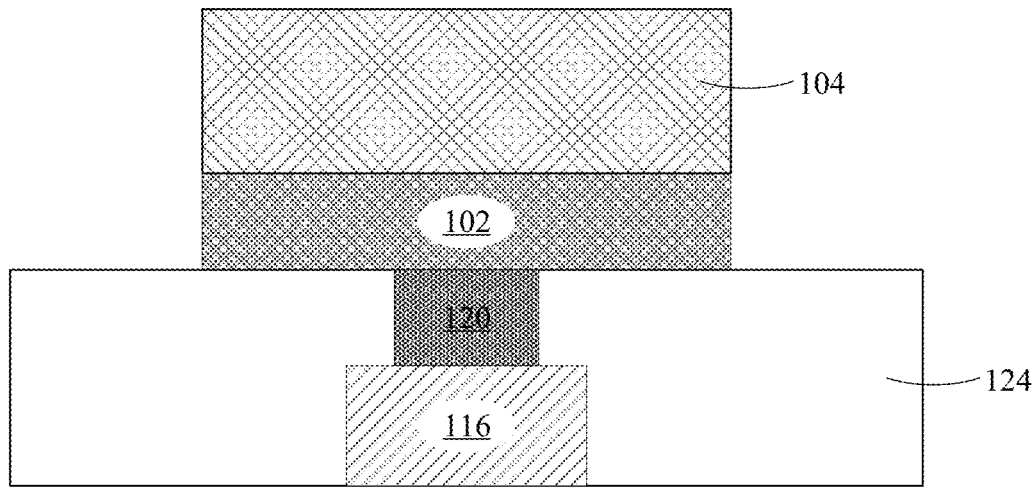
FIG. 13 through FIG. 18 are cross-sectional views depicting another exemplary set of steps for fabricating a memory device, in accordance with embodiments of the present disclosure.
Figure 14:
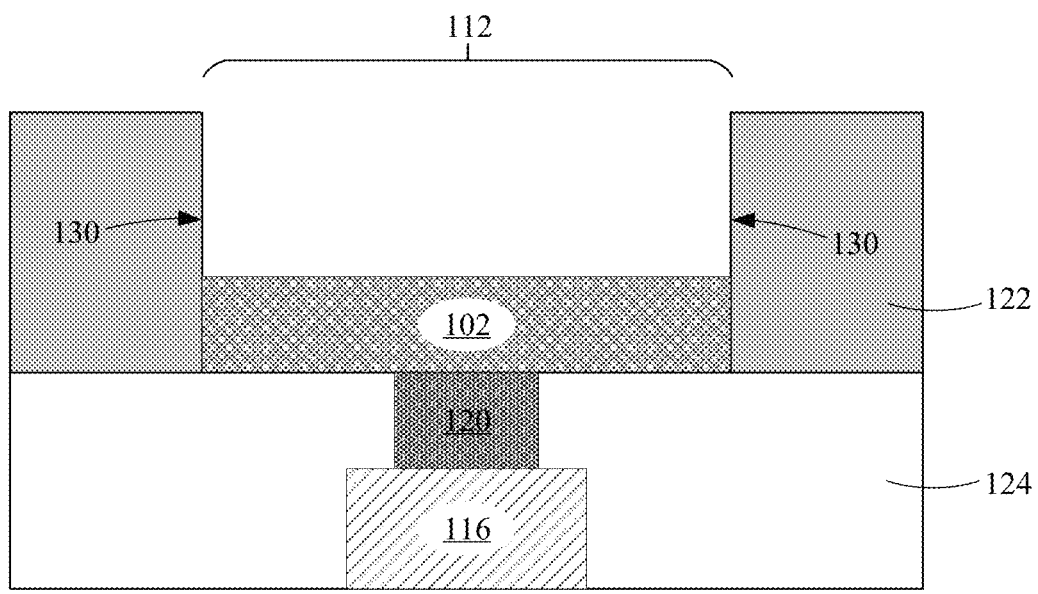

FIG. 13 and FIG. 14 illustrate the formation of a first electrode 102 in an opening 112 defined in the dielectric layer 122. As shown in FIG. 13, the first electrode 102 may be formed on the first dielectric region 124 and contacting the interconnect via 120, for example, by depositing a conductive material layer using the deposition techniques described herein, followed by patterning the deposited layer using the patterning techniques described herein. A mask element 104 may be used during the patterning step to form the first electrode 102.

As shown in FIG. 14, the dielectric layer 122 may be formed upon the first dielectric region 124 using the deposition techniques described herein. The deposited dielectric layer 122 may laterally surround the first electrode 102 and the mask element 104, such that the first electrode 102 and the mask element 104 are in an opening 112 defined in the dielectric layer 122. A chemical mechanical planarization (CMP) process may be performed on the upper surfaces of the mask element 104 and the dielectric layer 122. The mask element 104 may be subsequently removed using an etch process or a stripping process to expose the first electrode 102.

In an alternative embodiment (not shown) to form the first electrode 102 in the opening 112, the mask element 104 may be formed upon the dielectric layer 122, followed by etching portions of the dielectric layer 122 uncovered by the mask element 104 (using patterning techniques described herein) to define the opening 112 in the dielectric layer 122. Thereafter, the conductive material to form the first electrode 102 may be deposited in the opening 112 and upon the mask element 104. The mask element 104 and the conductive material deposited thereupon may be subsequently removed using etching or stripping processes. The first electrode 102 formed from this alternative embodiment may have a trapezoidal shape (i.e., the upper surface is narrower than the lower surface), as opposed to a rectangular shape depicted in FIG. 14.

Figure 15:
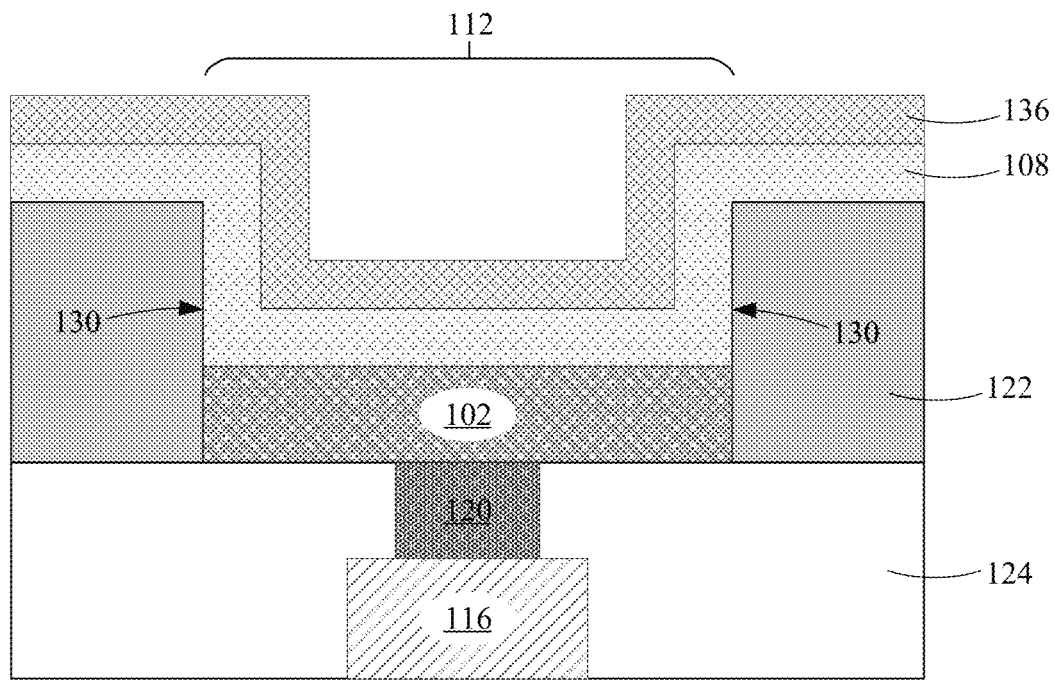

Referring to FIG. 15, a resistive layer 108 and an oxygen scavenging material layer 136 may be formed in the opening 112 using the deposition techniques described herein. For example, the resistive layer 108 may be deposited upon first electrode 102 and the dielectric layer 122 Preferably, a conformal deposition process such as an ALD process or a highly-conformal CVD process may be used to deposit the resistive layer 108 so that the resistive layer 108 lines the sidewalls 130 of the opening 112. Subsequently, the oxygen scavenging material layer 136 may be deposited to conform to the resistive layer 108.

Figure 16:
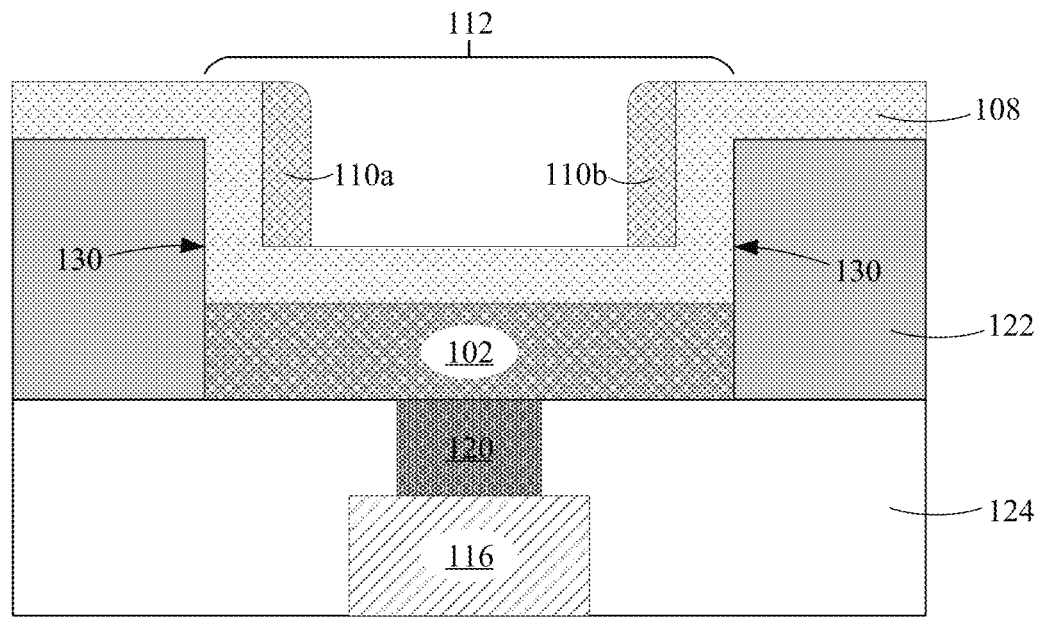

Referring to FIG. 16, the oxygen scavenging material layer 136 may be patterned using the patterning techniques described herein. The oxygen scavenging material layer 136 may be patterned to form the first oxygen scavenging layer 110a and the second oxygen scavenging layer 110b. An anisotropic etching technique (e.g., a "spacer etch" process) may be used in the patterning of the oxygen scavenging material layer 136.

Figure 17:
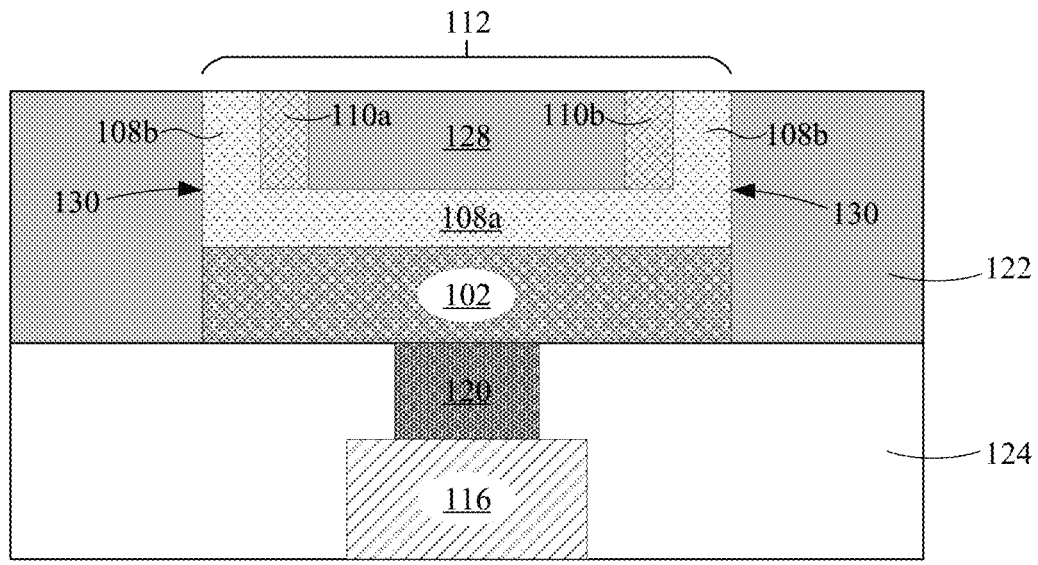

Referring to FIG. 17, the resistive layer 108 may be patterned to have a first segment 108a disposed upon the first electrode 102 and a second segment 108b disposed along the sidewalls of the opening. As shown, the oxygen scavenging layers 110a, 110b partially covers the resistive layer 108 after the patterning of the resistive layer 108. A dielectric cap 128 may be deposited upon the portion of the resistive layer 108 that is uncovered by the oxygen scavenging layers 110a, 110b. A chemical mechanical planarization (CMP) process may be performed to ensure that the upper surfaces of the dielectric layer 122, the oxygen scavenging layer 110a, 110b, the second segment 108b of the resistive layer 108, and the dielectric cap 128 are substantially coplanar with each other.

Figure 18:
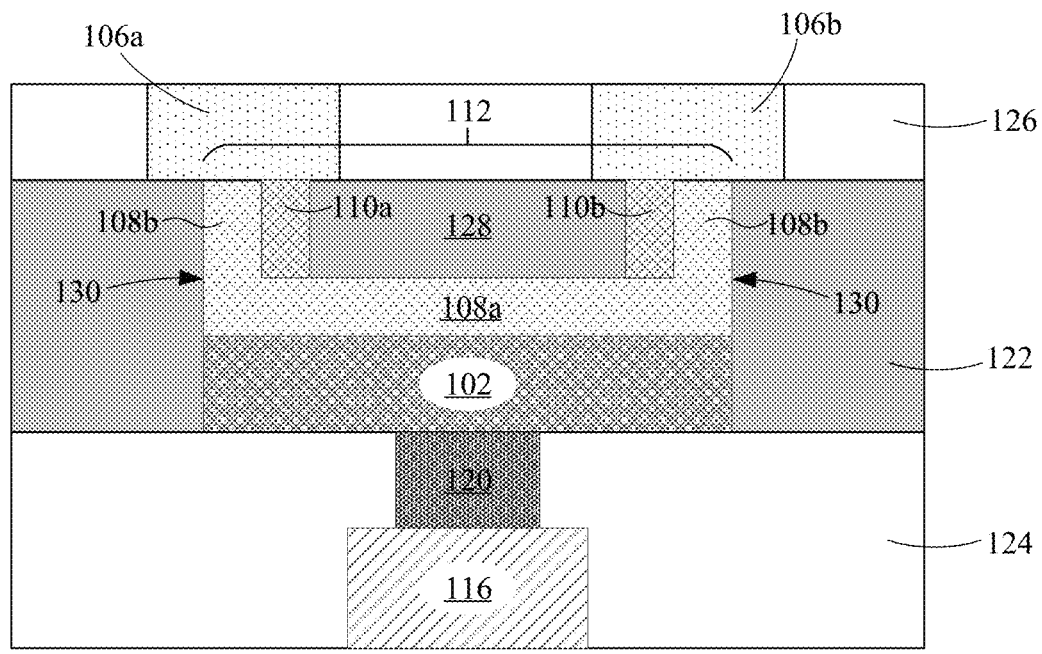

FIG. 18 illustrates the formation of electrodes to contact the oxygen scavenging layers 110a, 110b. As shown in FIG. 18, a second electrode 106a may be formed upon the first oxygen scavenging layer 110a and the second segment 108b of the resistive layer 108. A third electrode 106b may be formed upon the second oxygen scavenging layer 110b and the second segment 108b of the resistive layer 108. For example, a second dielectric region 126 may be formed upon the dielectric layer 122 by depositing dielectric materials using the deposition techniques described herein. The second dielectric region 126 may be subsequently patterned to define electrode openings (not shown) using the patterning techniques described herein.

The second electrode 106a and the third electrode 106b may be formed in the electrode openings by depositing conductive materials using the deposition techniques described herein. Further processing steps may be performed, such as the formation of interconnect structures in the second dielectric region 126 to provide electrical connections with the second electrode 106a and the third electrode 106b. In other embodiments, the patterning of the second dielectric region 126 may be modified to form a single electrode opening above the oxygen scavenging layers 110a, 110b for subsequent deposition of a metal therein.

Figure 19:
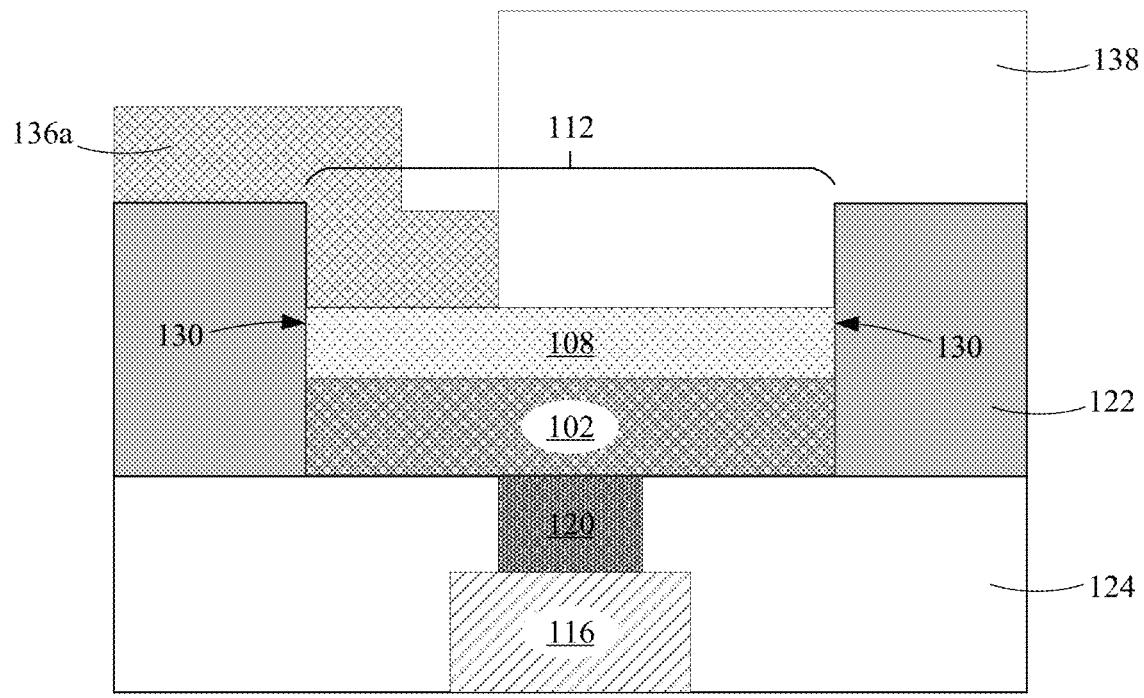
FIG. 19 through FIG. 22 are cross-sectional views depicting an alternative set of steps for forming oxygen scavenging layers with different widths and material, in accordance with embodiments of the present disclosure.
Figure 20:
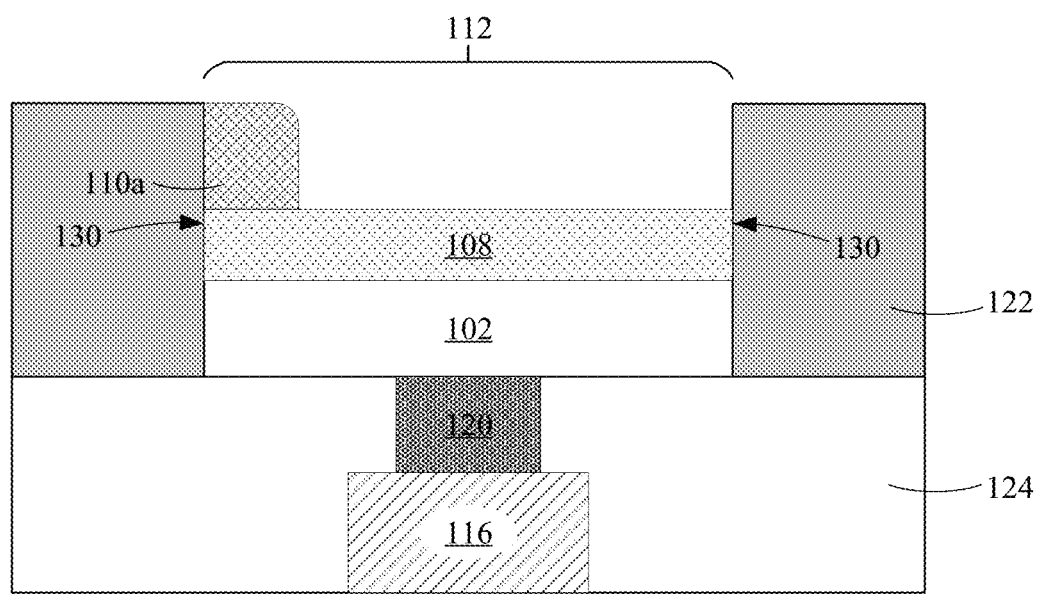

FIG. 19 through FIG. 22 illustrates an alternative set of steps for forming oxygen scavenging layers 110a, 110b with different widths and different material. In FIG. 19 (FIG. 19 continues from the embodiment shown in FIG. 8), a block element 138 may be deposited to cover a portion of the structure while a first oxygen scavenging material layer 136a may be deposited on the uncovered portion of the structure. The block element 138 may be a photoresist layer, or a hard mask layer. In FIG. 20, the first oxygen scavenging material layer 136a may be etched to form the first oxygen scavenging layer 110a, and the block element 138 may be removed.

The structure shown in FIG. 20 may be used to form embodiments where a single oxygen scavenging layer is present. For example, a second electrode may be formed upon the first oxygen scavenging layer 110a shown in FIG. 20, followed by the formation of the interconnect structures described herein.

Figure 21:
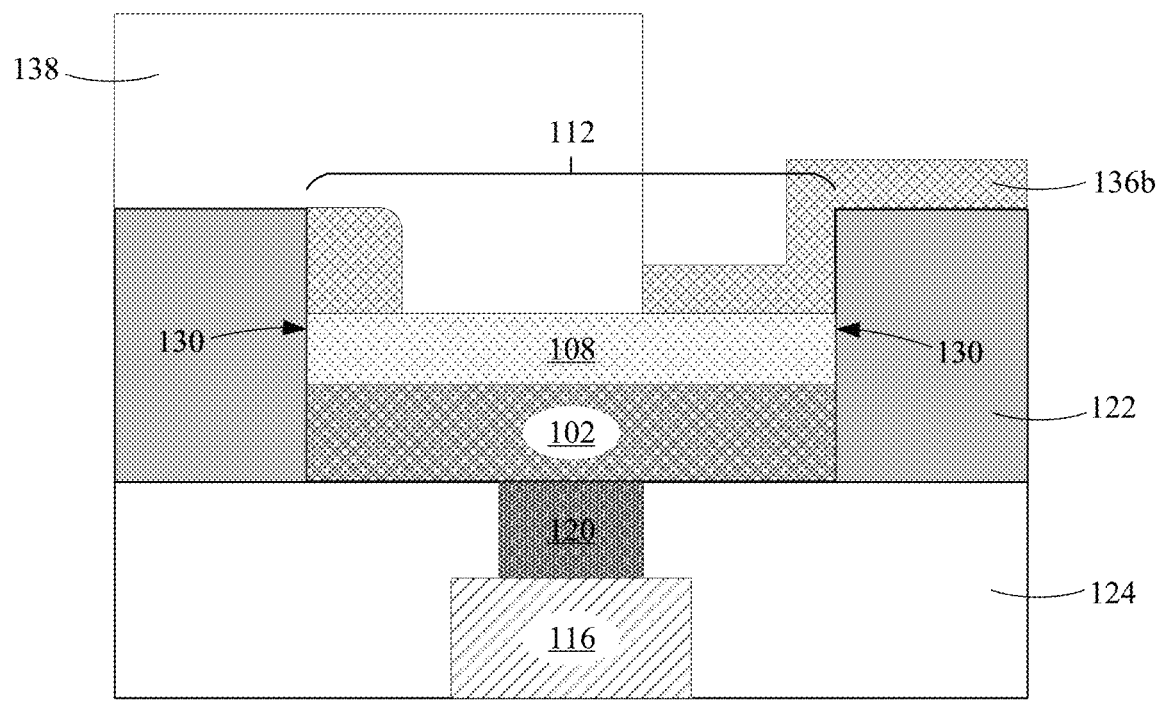

Referring to FIG. 21 (FIG. 21 continues from the embodiment shown in FIG. 20), a block element 138 may be deposited to cover the first oxygen scavenging layer 110a and a portion of the resistive layer 108, while leaving the remaining portion of the resistive layer 108 uncovered. A second oxygen scavenging material layer 136b may be deposited on the portion of the resistive layer 108 that is uncovered by the block element 138. The second oxygen scavenging material layer 136b may be deposited with a smaller thickness as compared to the first oxygen scavenging material layer 136a. Additionally, the second oxygen scavenging material layer 136b may include a different material from the first oxygen scavenging material layer 136a.

Figure 22:
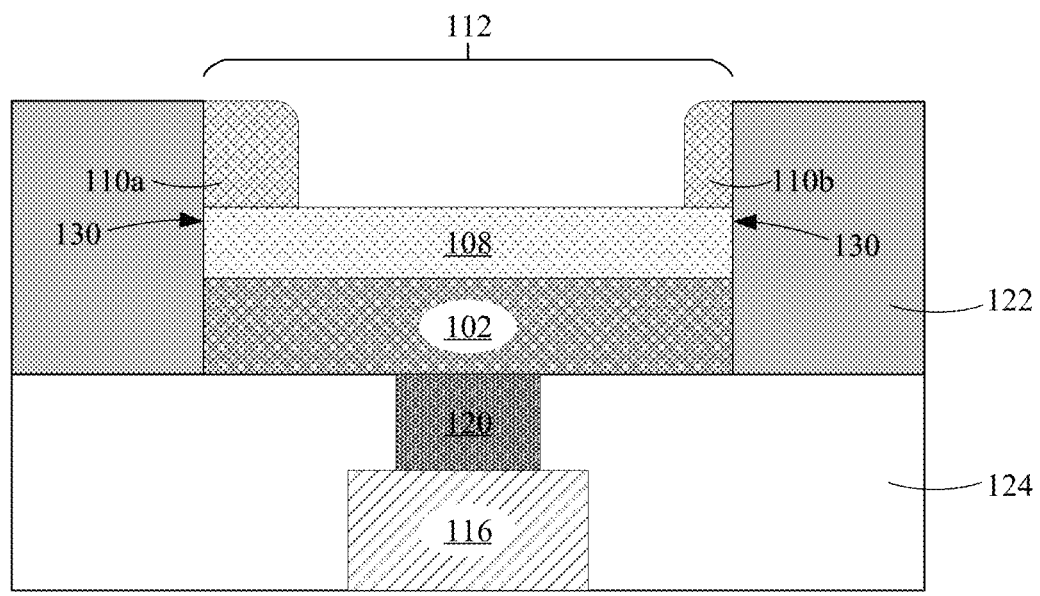

In FIG. 22, the second oxygen scavenging material layer 136b may be etched to form the second oxygen scavenging layer 110b, and the block element 138 may be removed. The structure shown in FIG. 22 may undergo further processing as described in FIG. 11 through FIG. 12.

Figure 23:
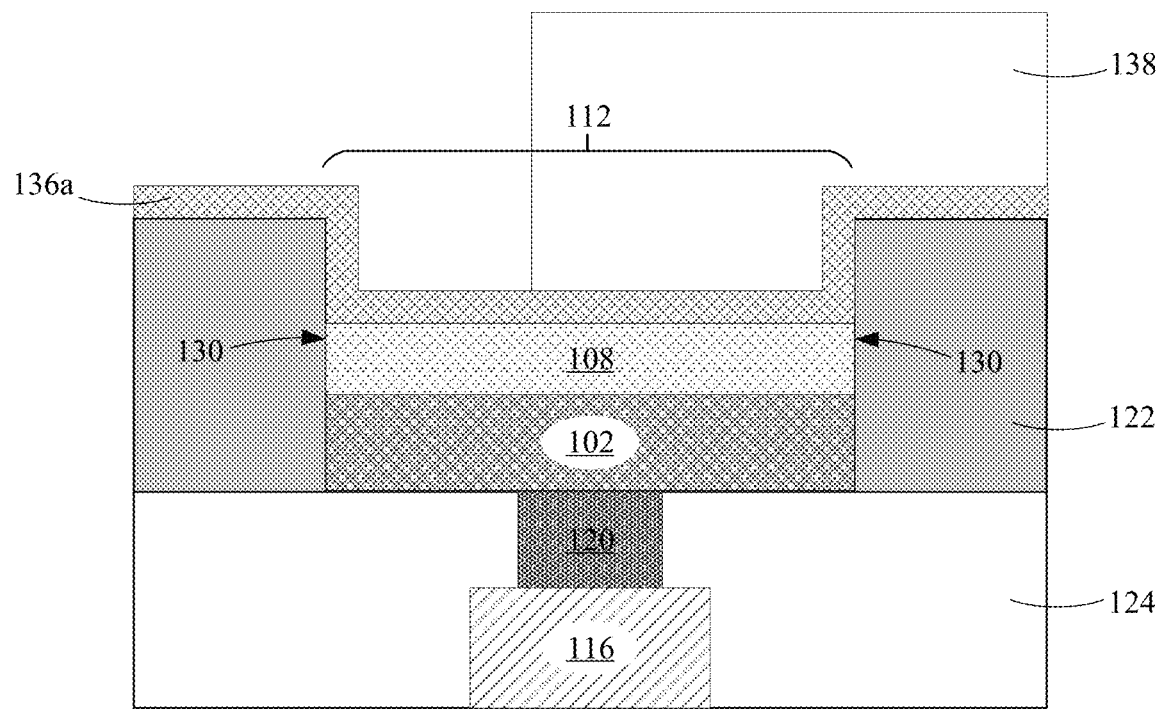
FIG. 23 through FIG. 27 are cross-sectional views depicting another alternative set of steps for forming oxygen scavenging layers with different widths and material, in accordance with embodiments of the present disclosure.

FIG. 23 through FIG. 27 illustrates yet another alternative set of steps for forming oxygen scavenging layers 110a, 110b with different widths and different material. In FIG. 23 (FIG. 23 continues from the embodiment shown in FIG. 9), a first oxygen scavenging material layer 136a may be deposited upon the dielectric layer 122 and within the opening 112, using the deposition techniques described herein. Preferably, a conformal deposition process such as an ALD process or a highly-conformal CVD process may be used. A block element 138 may be deposited to cover a portion of the first oxygen scavenging material layer 136a, while leaving the remaining portion of the first oxygen scavenging material layer 136a uncovered.

Figure 24:
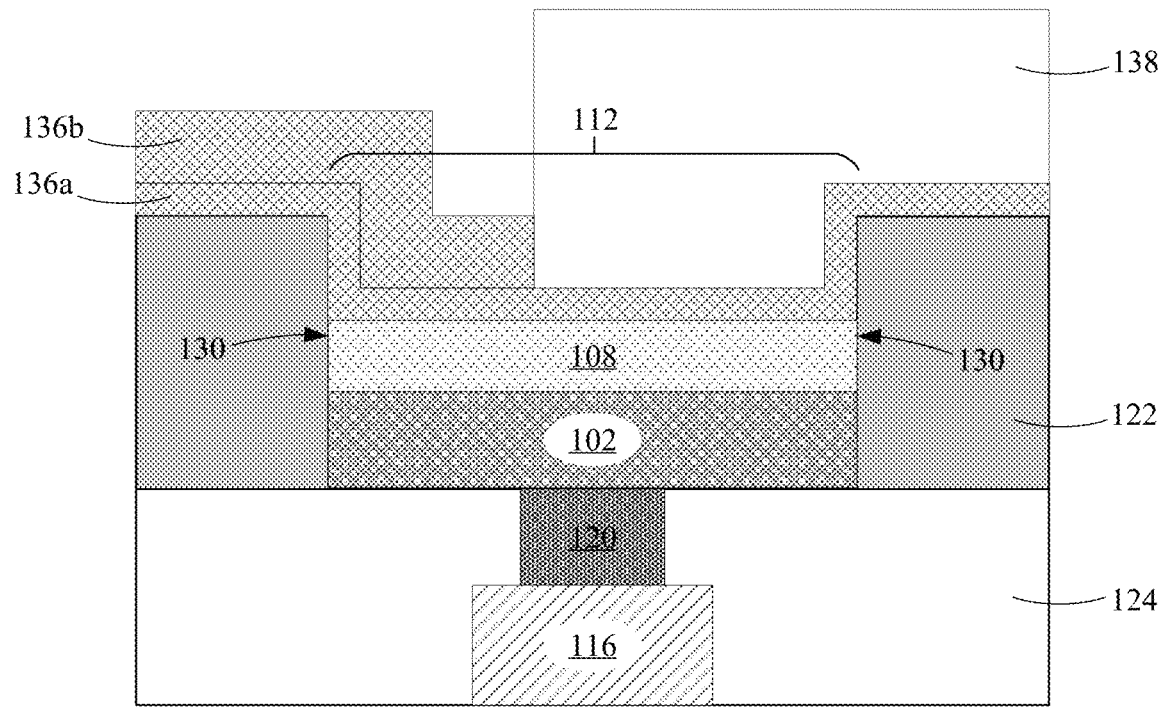

Referring to FIG. 24, a second oxygen scavenging material layer 136b may be deposited on the portion of the first oxygen scavenging material layer 136a that is uncovered by the block element 138. The second oxygen scavenging material layer 136b may be deposited with a larger thickness as compared to the first oxygen scavenging material layer 136a. Additionally, the second oxygen scavenging material layer 136b may include a different material from the first oxygen scavenging material layer 136a.

Figure 25:
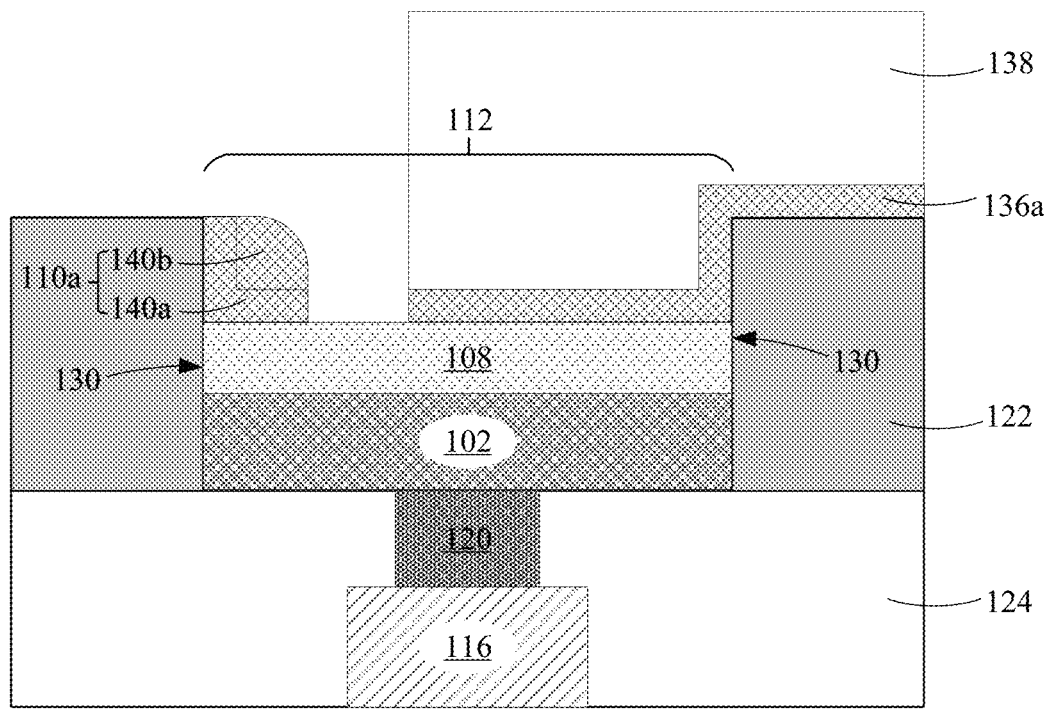

Referring to FIG. 25, the first oxygen scavenging material layer 136a and the second oxygen scavenging material layer 136b may be etched using an anisotropic etching technique to form the first oxygen scavenging layer 110a. The first oxygen scavenging layer 110a may have multiple sub-layers and includes the materials from the first oxygen scavenging material layer 136a and the second oxygen scavenging material layer 136b. For example, the first oxygen scavenging layer 110a may include a first sub-layer 140a and a second sub-layer 140b disposed upon the first sub-layer 140a.

Although not shown, depending on the desired structure of the first oxygen scavenging layer 110a, additional oxygen scavenging materials layers may be deposited over the portion of the first oxygen scavenging material layer 136a that is uncovered by the block element 138, as depicted in FIG. 24.

Figure 26:
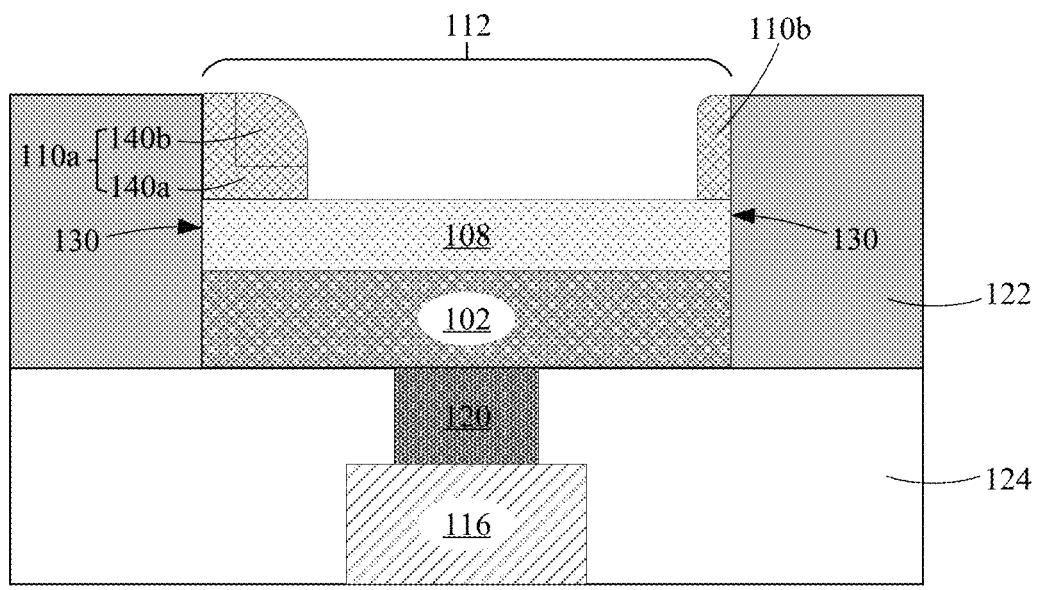

Referring to FIG. 26 (FIG. 26 continues from the embodiment shown in FIG. 25), the block element 138 may be removed, and the first oxygen scavenging material layer 136a previously covered by the block element 138 may be etched to form the second oxygen scavenging layer 110b. The second oxygen scavenging layer 110b may have a smaller width as compared to the first oxygen scavenging layer 110a.

Figure 27:
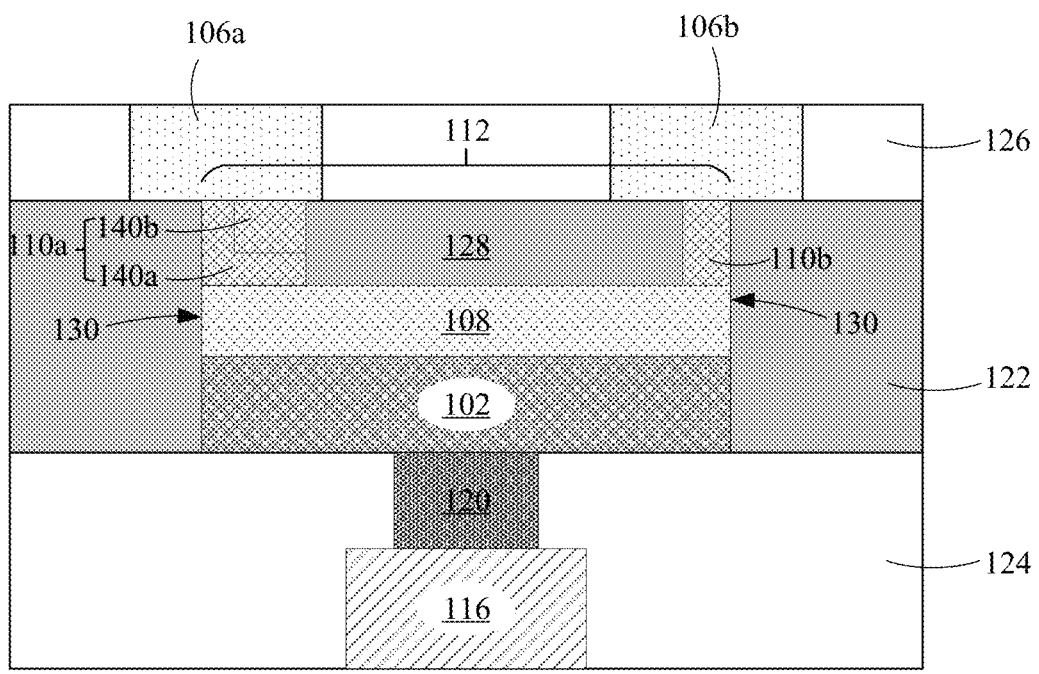

The structure shown in FIG. 26 may undergo further processing as described in FIG. 11 through FIG. 12. For example, as shown in FIG. 27 (FIG. 27 continues from the embodiment shown in FIG. 26), a dielectric cap 128 may be deposited upon the portion of the resistive layer 108 that is uncovered by the oxygen scavenging layers 110a, 110b. A CMP process may be performed to ensure that the upper surfaces of the dielectric layer 122, the oxygen scavenging layer 110a, 110b, and the dielectric cap 128 are substantially coplanar with each other. A second electrode 106a may be formed upon the first oxygen scavenging layer 110a, and a third electrode 106b may be formed upon the second oxygen scavenging layer 110b. The second electrode 106a and the third electrode 106b may be formed in a second dielectric region 126. Interconnect structures may be formed above the second electrode 106a and the third electrode 106b to provide electrical connections with the second electrode 106a and the third electrode 106b.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many processes are only mentioned briefly herein or omitted entirely without providing the well-known process details.

As will be readily apparent to those skilled in the art upon a complete reading of the present application, the disclosed semiconductor devices and methods of forming the same may be employed in manufacturing a variety of different integrated circuit products, including, but not limited to, memory cells, NV memory devices, FinFET transistor devices, CMOS devices, etc.

What is claimed is:

1. A memory device comprising:
   a dielectric layer having an opening;
   a first electrode in the opening;
   a resistive layer disposed upon the first electrode;
   a first oxygen scavenging layer disposed upon the resistive layer, wherein the first oxygen scavenging layer includes a material that is different from the resistive layer and partially covers the resistive layer;
   a second oxygen scavenging layer disposed upon the resistive layer, wherein the second oxygen scavenging layer is spaced apart from the first oxygen scavenging layer, and the second oxygen scavenging layer includes a material that is different from the resistive layer; and
   a second electrode in contact with the first oxygen scavenging layer.

2. The device of claim 1, wherein the first electrode is electrically linked to the second electrode by the first oxygen scavenging layer and the resistive layer.

3. The device of claim 1, wherein the first oxygen scavenging layer and the second oxygen scavenging layer each has an upper surface that is substantially coplanar with an upper surface of the dielectric layer.

4. The device of claim 3, wherein the second electrode extends laterally to contact the second oxygen scavenging layer.

5. The device of claim 4, further comprising:
   a bit line arranged above and being connected to the second electrode; and
   a source line arranged below and being connected to the first electrode.

6. The device of claim 3, further comprising a third electrode disposed upon the second oxygen scavenging layer, wherein the first electrode is electrically linked to the third electrode by the second oxygen scavenging layer and the resistive layer.

7. The device of claim 6, further comprising:
   a first bit line arranged above and being connected to the second electrode;
   a second bit line arranged above and being connected to the third electrode; and
   a source line arranged below and being connected to the first electrode.

8. The device of claim 1, further comprising sidewalls along the opening, wherein the first oxygen scavenging layer and the second oxygen scavenging layer have side facets that abut the sidewalls.

9. The device of claim 8, wherein the side facets of the first oxygen scavenging layer and the second oxygen scavenging layer are substantially aligned with side edges of the resistive layer.

10. The device of claim 8, wherein the first oxygen scavenging layer and the second oxygen scavenging layer have smaller widths than the resistive layer.

11. The device of claim 1, wherein the second oxygen scavenging layer is spaced apart from the first oxygen scavenging layer by a dielectric cap disposed upon the resistive layer.

12. The device of claim 1, wherein the first oxygen scavenging layer and the second oxygen scavenging layer include tantalum, titanium, tungsten, hafnium oxide, or aluminum oxide.

13. A memory device comprising:
   a dielectric layer having an opening;
   sidewalls along the opening;
   a first electrode in the opening;
   a resistive layer disposed upon the first electrode and along the sidewalls;
   a first oxygen scavenging layer disposed upon the resistive layer, wherein the first oxygen scavenging layer includes a material that is different from the resistive layer and partially covers the resistive layer;
   a second oxygen scavenging layer disposed upon the resistive layer, wherein the second oxygen scavenging layer is spaced apart from the first oxygen scavenging layer, and the second oxygen scavenging layer includes a material that is different from the resistive layer; and
   a second electrode in contact with the first oxygen scavenging layer and the resistive layer.

14. The device of claim 13, further comprising:
   a dielectric cap disposed upon the resistive layer,
   wherein the second oxygen scavenging layer is spaced apart from the first oxygen scavenging layer by the dielectric cap.

15. The device of claim 14, wherein the resistive layer has a first segment disposed upon the first electrode and a second segment disposed along the sidewalls.

16. The device of claim 15, wherein the second segment of the resistive layer has an upper surface that is substantially coplanar with an upper surface of the dielectric layer.

17. The device of claim 16, wherein the second electrode extends laterally to contact the second oxygen scavenging layer and the resistive layer.

18. The device of claim 16, further comprising a third electrode disposed upon the second oxygen scavenging layer, wherein the third electrode also contacts the resistive layer.

19. A method of forming a memory device comprising:
forming an opening in a dielectric layer;
forming a first electrode in the opening;
forming a resistive layer upon the first electrode;
forming a first oxygen scavenging layer and a second oxygen scavenging layer upon the resistive layer, the second oxygen scavenging layer being spaced apart from the first oxygen scavenging layer, wherein the first and the second oxygen scavenging layers include a material that is different from the resistive layer and partially covers the resistive layer; and
forming a second electrode upon the first oxygen scavenging layer.

20. The device of claim 1, wherein the second oxygen scavenging layer partially covers the resistive layer.

* * * * *